United States Patent
Chung et al.

(10) Patent No.: US 9,164,834 B2
(45) Date of Patent: Oct. 20, 2015

(54) SEMICONDUCTOR MEMORY DEVICES, MEMORY SYSTEMS INCLUDING THE SAME AND METHOD OF WRITING DATA IN THE SAME

(71) Applicants: Hoi-ju Chung, Yongin-si (KR); Chul-sung Park, Seoul (KR); Jae-Wook Lee, Seoul (KR); Jang-Woo Ryu, Seoul (KR); Tae-seong Jang, Yongin-si (KR); Gong-heum Han, Hwaseong-si (KR)

(72) Inventors: Hoi-ju Chung, Yongin-si (KR); Chul-sung Park, Seoul (KR); Jae-Wook Lee, Seoul (KR); Jang-Woo Ryu, Seoul (KR); Tae-seong Jang, Yongin-si (KR); Gong-heum Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 145 days.

(21) Appl. No.: 14/160,614

(22) Filed: Jan. 22, 2014

(65) Prior Publication Data

US 2014/0331101 A1    Nov. 6, 2014

Related U.S. Application Data

(60) Provisional application No. 61/819,728, filed on May 6, 2013.

(30) Foreign Application Priority Data

Oct. 8, 2013 (KR) .......................... 10-2013-0119651

(51) Int. Cl.
*G06F 11/10* (2006.01)
*G06F 11/08* (2006.01)
*G11C 29/42* (2006.01)

(52) U.S. Cl.
CPC .......... *G06F 11/1056* (2013.01); *G06F 11/085* (2013.01); *G06F 11/1008* (2013.01); *G11C 29/42* (2013.01)

(58) Field of Classification Search
CPC . G06F 11/1008; G06F 11/1056; G11C 29/00; G11C 29/42
See application file for complete search history.

(56) References Cited

U.S. PATENT DOCUMENTS

| | | | | |
|---|---|---|---|---|
| 4,817,095 | A * | 3/1989 | Smelser et al. | 714/764 |
| 5,235,693 | A * | 8/1993 | Chinnaswamy et al. | 711/159 |
| 5,996,052 | A | 11/1999 | Taniguchi et al. | |
| 7,124,348 | B2 * | 10/2006 | Nicolaidis | 714/767 |
| 7,568,146 | B2 * | 7/2009 | Takahashi et al. | 714/763 |
| 8,990,657 | B2 * | 3/2015 | Moyer | 714/763 |
| 2005/0229077 | A1 | 10/2005 | Takahashi | |
| 2007/0221724 | A1 * | 9/2007 | Kanai et al. | 235/382 |
| 2012/0324312 | A1 | 12/2012 | Moyer | |
| 2013/0073926 | A1 | 3/2013 | Nemazie | |

FOREIGN PATENT DOCUMENTS

| | | | |
|---|---|---|---|
| JP | 2009116967 A | 5/2009 | |
| JP | 2010123156 A | 6/2010 | |

* cited by examiner

*Primary Examiner* — Steve Nguyen

(74) *Attorney, Agent, or Firm* — Harness, Dickey & Pierce

(57) ABSTRACT

In one embodiment, the semiconductor device includes a memory array and a control architecture configured to control reading data from and writing data to the memory array. The control architecture is configured to receive data and a codeword location in the memory array, select one or more data units in the received data based on a data mask, read a codeword currently stored at the codeword location in the memory array, error correct the read codeword to generate a corrected read codeword, form a new codeword from the selected data units of the received data and data units in the corrected read codeword that do not correspond to the selected data units, and write the new codeword to the memory array.

34 Claims, 21 Drawing Sheets

SEMICONDUCTOR MEMORY DEVICES, MEMORY SYSTEMS INCLUDING THE SAME AND METHOD OF WRITING DATA IN THE SAME

CROSS-REFERENCE TO RELATED APPLICATION(S)

This US non-provisional application claims the benefit of priority under 35 USC §119 to U.S. Provisional Application No. 61/819,728 filed on May 6, 2013 in the USPTO and to Korean Patent Application No. 10-2013-0119651, filed on Oct. 8, 2013, in the Korean Intellectual Property Office (KIPO), the contents of which are incorporated herein in their entirety by reference.

BACKGROUND

1. Technical Field

Exemplary embodiments relate to memory devices, and more particularly to a memory system, a memory device, a memory system including the same and/or a method of writing data in the semiconductor memory device.

2. Discussion of the Related Art

Semiconductor memory devices may be classified into non-volatile memory devices such as flash memory devices and volatile memory devices such as DRAMs. DRAMs are cheap and are used for storing mass data such as system memories. As volatile memory devices such as DRAMs shrink, the bit error rate (BER) of memory cells in the DRAMs may rapidly increase.

SUMMARY

At least one embodiment relates to a semiconductor device.

In one embodiment, the semiconductor device includes a memory array and a control architecture configured to control reading data from and writing data to the memory array. The control architecture configured to receive data and a codeword location in the memory array, select one or more data units in the received data based on a data mask, read a codeword currently stored at the codeword location in the memory array, error correct the read codeword to generate a corrected read codeword, form a new codeword from the selected data units of the received data and data units in the corrected read codeword that do not correspond to the selected data units, and write the new codeword to the memory array.

In one embodiment, the control architecture is configured to receive the data mask. In one embodiment, the control architecture is configured to perform the selecting by selecting the data units in the received data not masked by the data mask.

In one embodiment, the control architecture is configured to receive the data mask from an external device.

In one embodiment, the control architecture is configured to generate the data mask. In one embodiment, the control architecture is configured to perform the selecting by selecting the data units in the received data not masked by the data mask.

In one embodiment, the control architecture is configured to generate the data mask when the received data has a size less than a size of a codeword.

In one embodiment, the control architecture is configured to generate the data mask based on a received address.

In one embodiment, the control architecture is configured to receive an address for the codeword location, and the control architecture is configured to read the read codeword based on the received address.

In one embodiment, the control architecture is configured to perform the error correcting based on parity information in the read codeword.

In one embodiment, the control architecture is configured to perform the forming by generating new parity bits, and including the new parity bits in the new codeword.

In one embodiment, the control architecture is configured to perform the forming by generating new parity bits, and including the new parity bits in the new codeword.

In one embodiment, the control architecture is configured to at least one of receive and generate the data mask.

In one embodiment, the read codeword includes a message information portion and a parity information portion. The message information portion may include a plurality of data units. Each of the data units may be a byte.

In one embodiment, the memory array includes a plurality of chips, and the read codeword is stored across more than one chip in the memory array.

In another embodiment, the semiconductor device includes a memory array and a control architecture configured to control reading data from and writing data to the memory array. The control architecture is configured to receive data and a codeword location in the memory array, read a codeword currently stored at the codeword location in the memory array, error correct the read codeword to generate a corrected read codeword, select one or more data units in the corrected read codeword for writing to the codeword location in the memory array based on a data mask, form a new codeword from the selected data units of the corrected read codeword and data units of the received data that do not correspond to the selected data units; and write the new codeword to the memory array.

At least one embodiment relates to a memory system.

In one embodiment, the memory system includes a plurality of memory chips, and each memory chip includes the semiconductor device according to one of the above-described embodiments.

At least one embodiment relates to a method.

In one embodiment, the method includes receiving data and a codeword location in a memory array, selecting one or more data units in the received data based on a data mask, reading a codeword currently stored at the codeword location in the memory array, error correcting the read codeword to generate a corrected read codeword, forming a new codeword from the selected data units of the received data and data units in the corrected read codeword that do not correspond to the selected data units, and writing the new codeword to the memory array.

In one embodiment, the method further includes receiving the data mask. The receiving the data mask may receive the data mask from an external device.

In one embodiment, the selecting selects the data units in the received data not masked by the data mask.

In one embodiment, the method includes generating the data mask. The generating may generate the data mask when the received data has a size less than a size of a codeword. In another embodiment, the generating generates the data mask based on a received address.

In one embodiment, the receiving receives an address for the codeword location, and the reading reads the read codeword based on the received address.

In one embodiment, the error correcting error corrects based on parity information in the read codeword.

In one embodiment, the forming generates new parity bits, and includes the new parity bits in the new codeword.

In one embodiment, the read codeword includes a message information portion and a parity information portion. The message information portion may include a plurality of data units. Each of the data units may be a byte.

In one embodiment, the memory array includes a plurality of chips, and the reading reads portions of the read codeword from more than one chip in the memory array.

In another embodiment, the method includes receiving data and a codeword location in a memory array, reading a codeword currently stored at the codeword location in the memory array, error correcting the read codeword to generate a corrected read codeword, selecting one or more data units in the corrected read codeword for writing to the codeword location in the memory array based on a data mask, forming a new codeword from the selected data units of the corrected read codeword and data units of the received data that do not correspond to the selected data units, and writing the new codeword to the memory array.

BRIEF DESCRIPTION OF THE DRAWINGS

Illustrative, non-limiting exemplary embodiments will be more clearly understood from the following detailed description taken in conjunction with the accompanying drawings.

DETAILED DESCRIPTION OF THE EMBODIMENTS

Figure 1:
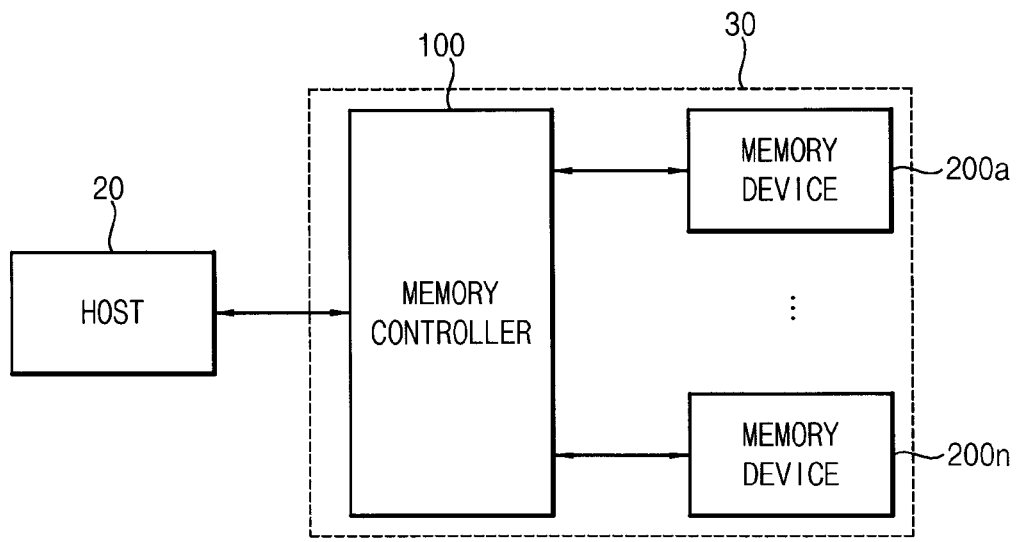
FIG. 1 is a block diagram illustrating an electronic system according to some example embodiments.

Various exemplary embodiments will be described more fully hereinafter with reference to the accompanying drawings, in which some exemplary embodiments are shown. The example embodiments may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an electronic system according to some example embodiments.

Referring to FIG. 1, an electronic system 10 includes a host 20 and a memory system 30. The memory system 30 includes a memory controller 100 and a plurality of semiconductor memory devices 200a~200n.

The host 20 may communicate with the memory system 30 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 20 may communicate with the memory system 30 through interface protocols such as Universal Serial Bus (USB), Multi-Media Card (MMC), Enhanced Small Disk Interface (ESDI), or Integrated Drive Electronics (IDE).

The memory controller 100 controls overall operation of the memory system 30. The memory controller 100 controls overall data exchange between the host 20 and the semiconductor memory devices 200a~200n. For example, the memory controller 100 writes data in the semiconductor memory devices 200a~200n or reads data from the semiconductor memory devices 200a~200n in response to request from the host 20.

In addition, the memory controller 100 issues operation commands to the semiconductor memory devices 200a~200n for controlling the semiconductor memory devices 200a~200n. These commands may include read, write and refresh commands. The commands may be issued in the form of transmitting a command code to identify the command along with an address, identifying a memory location. For some operations, such as some refresh operations, the command may be issued in the form a command code only and one or more addresses may be provided internally by the semiconductor memory device, or issued in the form of a command code with an address which is used by the semiconductor memory device to generate multiple addresses corresponding to the command (e.g., as a start address for a burst refresh operation for multiple addresses generated by an internal counter of the semiconductor memory device).

In some embodiments, each of the semiconductor memory devices 200a~200n may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc., or may be other volatile semiconductor memory devices that may include a refresh operation. In some embodiments, one or more of the semiconductor memory devices may be a non-volatile semiconductor memory device in which a data refresh operation or similar operation, such as a data copyback operations, may be used in response to determining that read disturbances may have altered programming states of a NAND flash semiconductor memory device.

Figure 2:
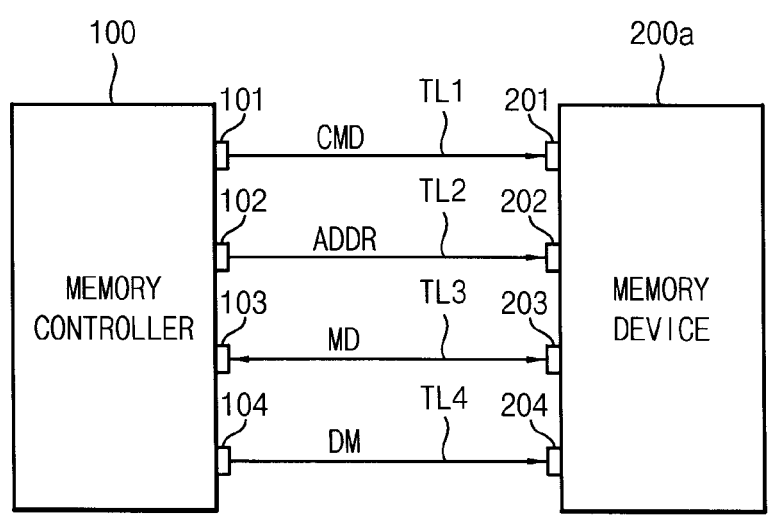
FIG. 2 is a block diagram illustrating an example of the memory system in FIG. 1 according to an embodiment.

FIG. 2 is a block diagram illustrating an example of the memory system in FIG. 1 according to an embodiment.

In FIG. 2, only one semiconductor memory device 200a in communication with the memory controller 100 is illustrated for convenience. However, the details discussed herein related to semiconductor memory device 200a may equally apply to the other semiconductor memory devices 200b~200n.

Referring to FIG. 2, the memory system 30 includes the memory controller 100 and the semiconductor memory device 200a. Each of the memory controller 100 and the semiconductor memory device 200a may be formed as a separate semiconductor chip or as a separate group of chips (e.g., semiconductor memory device 200a may a stack of semiconductor chips in a semiconductor package). The memory controller 100 and the semiconductor memory device 200a may be connected to each other through corresponding command pins 101 and 201, corresponding address pins 102 and 202, corresponding data pins 103 and 203 and corresponding separate pins 104 and 204. The command pins 101 and 201 transmit a command signal CMD through a command transmission line TL1, the address pins 102 and 202 transmit an address signal ADDR through an address transmission line TL2, the data pins 103 and 203 exchange main data MD through a data transmission line TL3 and the separate pins 104 and 204 transmit a data mask signal DM through a separate transmission line TL4.

Further, other pin/transmission line arrangements may be utilized, such as pins/transmission lines that each transmit and/or receive two or more of address, data and command information (e.g., command/address pins (CA) for the communication of command and address information over shared transmission lines). In addition, the use of the word pins is used in the generic sense and should not be considered limited to prong type connectors, but includes any communication terminals of a semiconductor device, such as solder bumps or solder balls in a ball grid array package for electrical communication of signals, and optical terminals for transmitting and receiving optical signals, etc.

As will be described later, the semiconductor memory device 200a performs partial updating operation in which the semiconductor memory device 200a writes some of the main data MD to the memory cell array in response to at least one of the data mask signal DM and an internal address signal. When the semiconductor memory device 200a performs the partial updating operation, the semiconductor memory device 200a may perform a masked write operation in response to the data mask signal DM or the semiconductor memory device 200a may perform partial write operation in response the internal address signal based on an external address. In addition, the semiconductor memory device 200a may perform a combined masked write operation and partial write operation in response to the data mask signal DM and the internal address signal. That is, the partial updating operation may include at least one of the masked write operation and the partial write operation.

Referring to FIGS. 1 and 2, the memory controller 100 may input data to the semiconductor memory device 200a or may output data from the semiconductor memory device 200a through the data pins 103 and 203 based on the request from the host 20. In addition, the semiconductor memory device 200a may receive the data mask signal DM through the extra pins 104 and 204.

The memory controller 100 transmits the data mask signal DM to the semiconductor memory device 200a such that the semiconductor memory device 200a performs the masked write operation on the main data MD including a plurality of unit data. When the semiconductor memory device 200a performs the masked write operation, the semiconductor memory device 200a reads initial data that is stored in a memory cell array for unit data to be masked, corrects errors in the initial data and rewrites the corrected initial data to the memory cell array.

Figure 3:
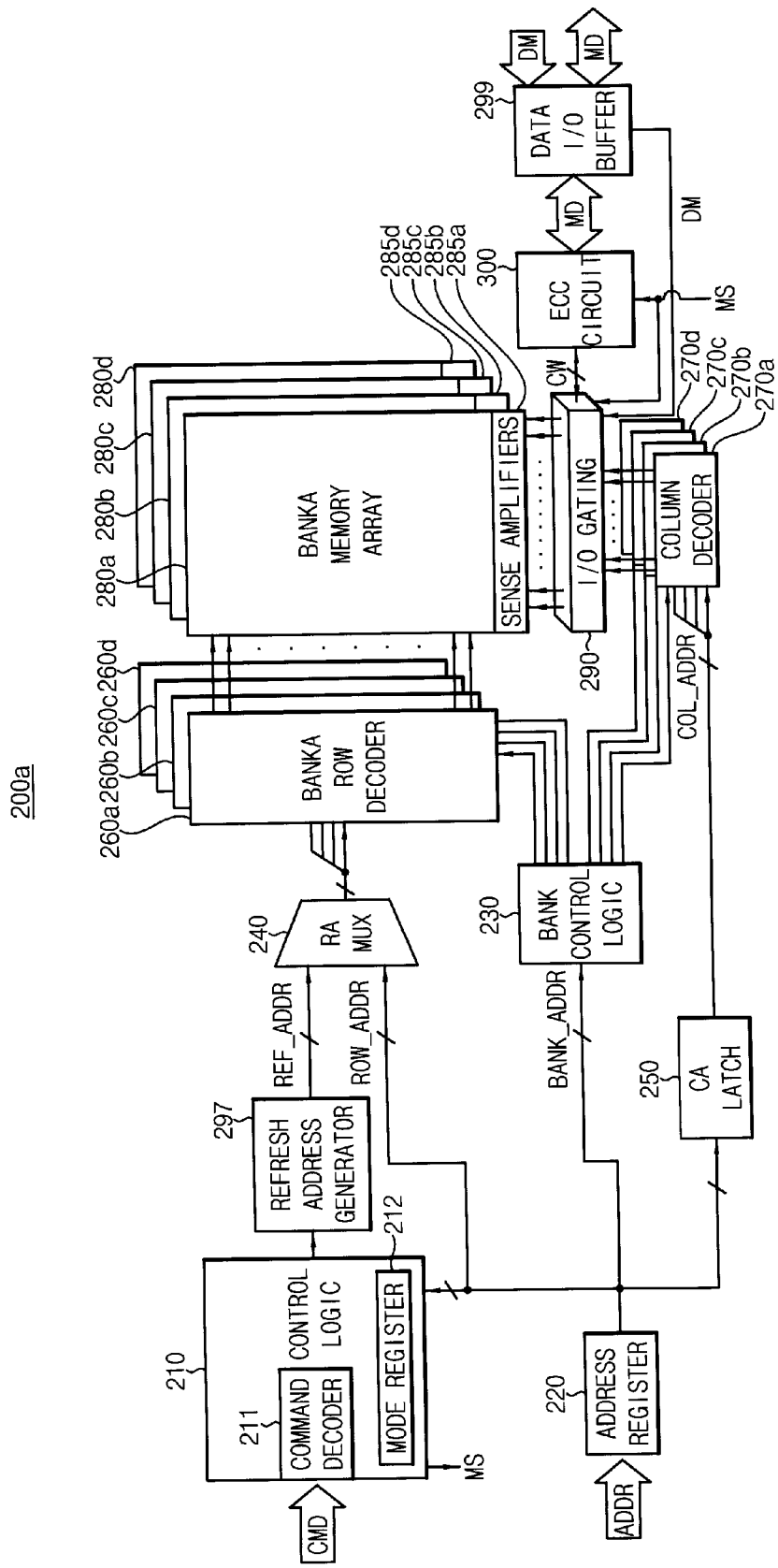
FIG. 3 is a block diagram illustrating an example of the memory device in FIG. 2 according to some example embodiments.

FIG. 3 is a block diagram illustrating an example of the semiconductor memory device in FIG. 2 according to some example embodiments.

Referring to FIG. 3, the semiconductor memory device 200a includes a control logic 210, an address register 220, a bank control logic 230, a row address multiplexer 240, a column address latch 250, a row decoder 260, a column decoder 270, a memory cell array 280, a sense amplifier unit 205, an input/output (I/O) gating circuit 290, an error check and correction (ECC) circuit 300, a data input/output (I/O) buffer 299 and a refresh address generator 297. In some embodiments, the semiconductor memory device 200a may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc., or may be other volatile semiconductor memory devices that require a refresh operation.

The memory cell array 280 may include first through fourth bank arrays 280a, 280b, 280c and 280d. The row decoder 260 may include first through fourth bank row decoders 260a, 260b, 260c and 260d respectively coupled to the first through fourth bank arrays 280a, 280b, 280c and 280d, the column decoder 270 may include first through fourth bank column decoders 270a, 270b, 270c and 270d respectively coupled to the first through fourth bank arrays 280a, 280b, 280c and 280d, and the sense amplifier unit 285 may include first through fourth bank sense amplifiers 285a, 285b, 385c and 385d respectively coupled to the first through fourth bank arrays 280a, 280b, 280c and 280d. The first through fourth bank arrays 280a, 280b, 280c and 280d, the first through fourth bank row decoders 260a, 260b, 260c and 260d, the first through fourth bank column decoders 270a, 270b, 270c and 270d and the first through fourth bank sense amplifiers 285a, 285b, 285c and 285d may form first through fourth banks. Although the semiconductor memory device 200a is illustrated in FIG. 3 as including four banks, the semiconductor memory device 200a may include any number of banks.

The address register 220 may receive an address ADDR including a bank address BANK_ADDR, a row address ROW_ADDR and a column address COL_ADDR from a memory controller (not shown). The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through fourth bank row decoders 260a, 260b, 260c and 260d corresponding to the bank address BANK_ADDR may be activated in response to the bank control signals, and one of the first through fourth bank column decoders 270a, 270b, 270c and 270d corresponding to the bank address BANK_ADDR may be activated in response to the bank control signals.

The row address multiplexer 240 may receive the row address ROW_ADDR from the address register 220, and may receive a refresh row address REF_ADDR from the refresh address generator 297. The row address multiplexer 240 may selectively output the row address ROW_ADDR or the refresh row address REF_ADDR. A row address output from the row address multiplexer 240 may be applied to the first through fourth bank row decoders 260a, 260b, 260c and 260d.

The activated one of the first through fourth bank row decoders 260a, 260b, 260c and 260d may decode the row address output from the row address multiplexer 240, and may activate a word line corresponding to the row address. For example, the activated bank row decoder may apply a word line driving voltage to the word line corresponding to the row address.

The column address latch 250 may receive the column address COL_ADDR from the address register 220, and may temporarily store the received column address COL_ADDR. In some embodiments, in a burst mode, the column address latch 250 may generate column addresses that increment from the received column address COL_ADDR. The column address latch 250 may apply the temporarily stored or generated column address to the first through fourth bank column decoders 270a, 270b, 270c and 270d.

The activated one of the first through fourth bank column decoders 270a, 270b, 270c and 270d may decode the column address COL_ADDR output from the column address latch 250, and may control the input/output gating circuit 290 to output data corresponding to the column address COL_ADDR.

The I/O gating circuit 290 may include circuitry for gating input/output data. The I/O gating circuit 290 may further include an input data mask logic, read data latches for storing data output from the first through fourth bank arrays 280a, 280b, 280c and 280d, and write drivers for writing data to the first through fourth bank arrays 280a, 280b, 280c and 280d.

Main data MD to be read from one bank array of the first through fourth bank arrays 280a, 280b, 280c and 280d may be sensed by a sense amplifier 285 coupled to the one bank array 280, and may be stored in the read data latches. The main data MD stored in the read data latches may be provided to the memory controller 100 via the ECC circuit 300 and the data I/O buffer 299. Main data MD to be written to one bank array of the first through fourth bank arrays 280a, 280b, 280c and 280d may be provided from the memory controller 100 to the data I/O buffer 299. Main data MD provided to the data I/O buffer 299 may be encoded in the ECC circuit 300, and may be written to the one array bank via the write drivers.

The data I/O buffer 299 may provide the ECC circuit 300 with the main data MD from the memory controller 100 and may provide the I/O gating circuit 290 with the data mask signal DM from the memory controller 100.

The ECC circuit 300 receives the main data MD including a plurality of unit data from the memory controller 100, encodes the main data MD to generate parity data and provide the I/O gating circuit 290 with a codeword including the main data MD and the parity data. In addition, the ECC circuit 300 receives a read codeword CW from the I/O gating circuit 290 and decodes the read codeword CW to provide read main data MD to the data I/O buffer 299.

When a mode signal MS from the control logic 210 indicates a masked write operation, the I/O gating circuit 290 reads initial data that is stored in the memory cell array, provides the initial data to the ECC circuit 300, receives corrected initial data from the ECC circuit 300 and rewrites corresponding unit data of the corrected initial data for the unit data to be masked. Therefore, the semiconductor memory device 200a may reduce bit error rate.

The control logic 210 may control operations of the semiconductor memory device 200a. For example, the control logic 210 may generate control signals for the semiconductor memory device 200a to perform a write operation or a read operation. For example, the control logic 210 may generate the mode signal MS for the semiconductor memory device 200a to perform the partial updating operation including the masked write operation. The control logic 210 may include a command decoder 211 that decodes a command CMD received from the memory controller 100 and a mode register 212 that sets an operation mode of the volatile semiconductor memory device 200. For example, the command decoder 211 may generate the control signals corresponding to the command CMD by decoding a write enable signal (/WE), a row address strobe signal (/RAS), a column address strobe signal (/CAS), a chip select signal (/CS), etc. The command decoder 211 may further receive a clock signal (CLK) and a clock enable signal (/CKE) for operating the volatile semiconductor memory device 200 in a synchronous manner. The control logic 210 may control the refresh address generator 297 to generate the refresh row address REF_ADDR.

The semiconductor memory device 200a performs the partial updating operation on the codeword in response to at least one of the data mask signal DM and an internal address signal. When the semiconductor memory device 200a performs the partial updating operation, the I/O gating circuit 290 reads initial data that is stored in the memory cell array, provides the initial data to the ECC circuit 300, receives corrected initial data from the ECC circuit 300 and rewrites corresponding unit data of the corrected initial data for the unit data to be masked or not to be updated.

Figure 4:
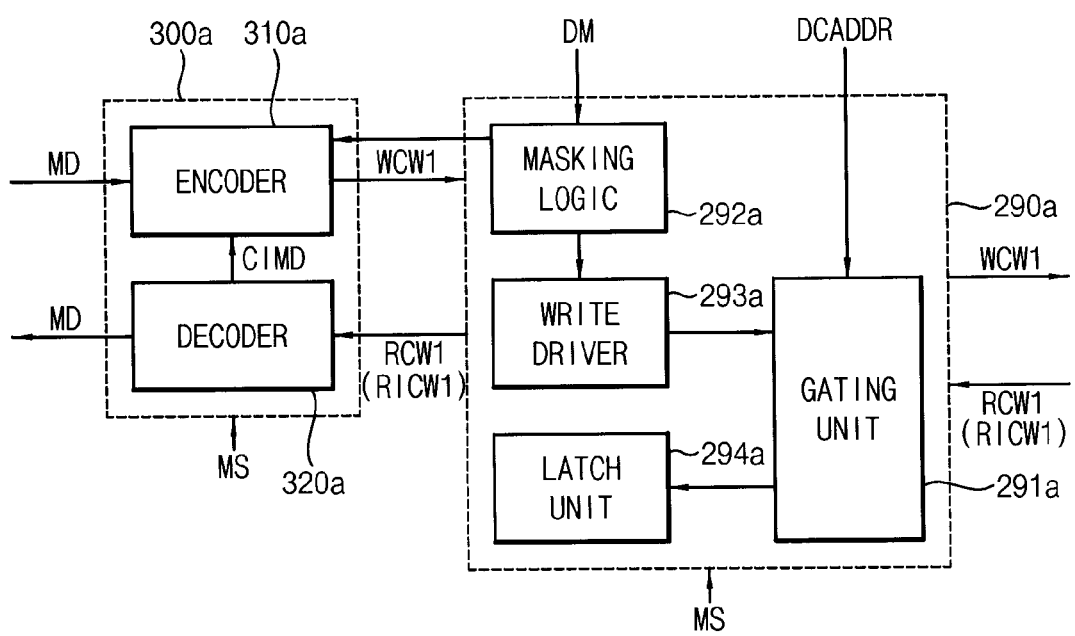
FIG. 4 is a block diagram illustrating an example of the ECC circuit and the I/O gating circuit in FIG. 3 according to an example embodiment.

FIG. 4 is a block diagram illustrating an example of the ECC circuit and the I/O gating circuit in FIG. 3 according to an example embodiment.

Referring to FIG. 4, an ECC circuit 300a includes an encoder 310a and a decoder 320a. An I/O gating circuit 290a includes a write driver 293a, a mask logic 292a, a gating unit 291a and a latch unit 294a.

The encoder 310a receives the main data MD, encodes the main data MD to generate parity data and provides the I/O gating circuit 290a with a codeword (or write codeword) WCW1 including the main data MD and the parity data in a write operation.

The decoder 320a receives a read codeword RCW1 from the I/O gating circuit 290a, corrects errors in the codeword (or read codeword) RCW1 using parity data included in the codeword RCW1 and provides error-corrected main data MD to the memory controller 100 through the data I/O buffer 299 in a read operation. In addition, the decoder 320a receives from the I/O gating circuit 290a initial codeword RICW1 that is randomly stored in the memory cell array, corrects errors in the initial codeword RIC and provides corrected initial data CIMD to the encoder 310a when the mode signal MS indicates the partial updating operation including the masked write operation.

When the mode signal MS indicates the masked write operation, the encoder 310a receives the data mask signal (described below) from the I/O gating circuit 290a, and receives the corrected initial data CIMD from the decoder 320a. The encoder 310a generates parity data based on the main data MD (or first main data), the corrected initial data CIMD and the data mask information; and provides the I/O gating circuit 290a with a combination of the main data MD and the corrected initial data CIMD (or second main data) and the parity data. That is, when the mode signal MS indicates the masked write operation, the encoder 310a receives the first main data MD including a plurality of unit data, generates the second main data and the parity data based on the first main data and the initial data that is stored in the memory cell array and provides the I/O gating circuit 290a with the codeword including the second main data and the parity data. When the mode signal MS indicates the masked write operation, the codeword WCW1 provided to the I/O gating circuit 290a may include unit data not to be masked corresponding to unit data in the first main data, unit data to be masked corresponding to unit data in the corrected initial data CIMD and the parity data.

The gating unit 291a gates the write codeword to the memory cell array and gates the read codeword from the memory cell array to the latch unit 294a in response to decoded column address (or external address) DCADDR. The mask logic 292a controls the write driver 293a to perform the masked write operation in response to the data mask signal DM and provides the data mask signal to the encoder 310a. When the mode signal MS indicates the masked write operation, the latch unit 294a provides the decoder 320a with the initial data (or initial codeword) RICW1 that is stored in the memory cell array.

When the write driver 293a performs the masked write operation on the main data under control of the mask logic 292a, the write driver 293a writes to the memory cell array corresponding unit data of the main data for the unit data not to be masked and rewrites to the memory cell array corresponding unit data of the corrected initial data for the unit data to be masked.

Therefore, in the conventional semiconductor memory device in which the unit data not to be masked is written to the memory cell array, a number of errors in one codeword may exceed error correction capability of the ECC circuit due to errors in the initial data. However, according to the semiconductor memory device 200a, corresponding unit data of the corrected initial data for the unit data to be masked is rewritten in the memory cell array, and thus a number of errors in one codeword may be controlled under the error correction capability of the ECC circuit 300a, and the ECC circuit 300a may handle an increased bit error rate.

Therefore, the ECC circuit 300a may perform an on-chip error correction operation on the initial data. In addition, the ECC circuit 300a and the I/O gating circuit 290a may perform on-chip read-modify-write operation on the initial data FIG. 5 illustrates a state of a target page before the semiconductor memory device is initialized.

Figure 5:
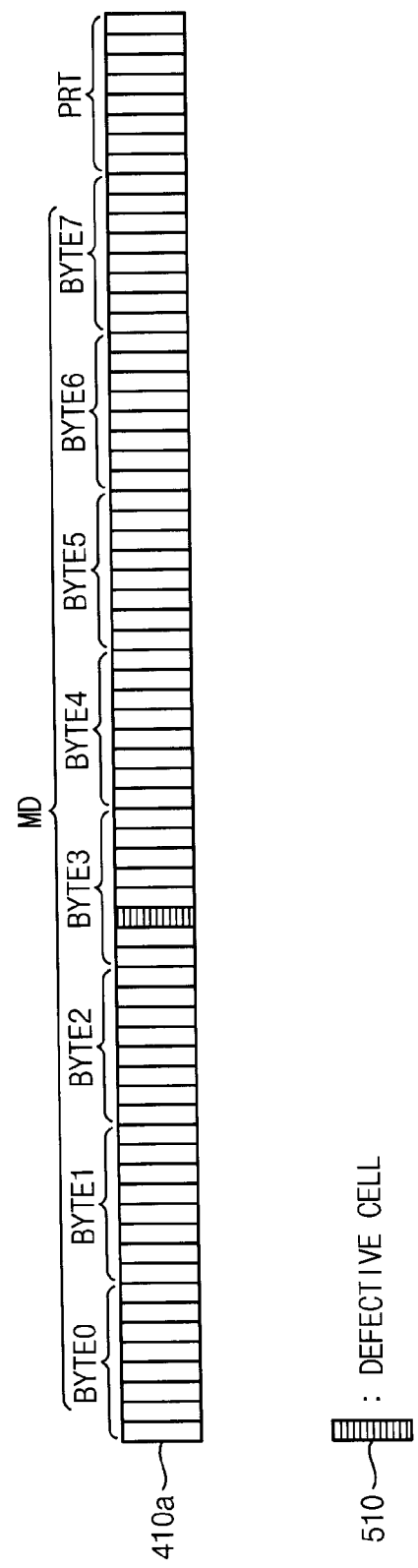
FIG. 5 illustrates a state of a target page before the semiconductor memory device is initialized.

Referring to FIG. 5, a target page 410a on which the write operation to be performed includes a data region in which a plurality of unit data BYTE0~BYTE7 is to be stored and a parity region in which parity data PRT is to be stored. The plurality of data units BYTE0 to BYTE7 may be referred to as a message. The message data plus the parity data may be referred to as a codeword, and the region where the codeword is stored may be referred to as a codeword location. In FIG. 5, a reference numeral 510 denotes a defective cell including at least one error in a fourth unit data BYTE3. Each of the unit data BYTE0~BYTE7 may be a byte.

Figure 6:
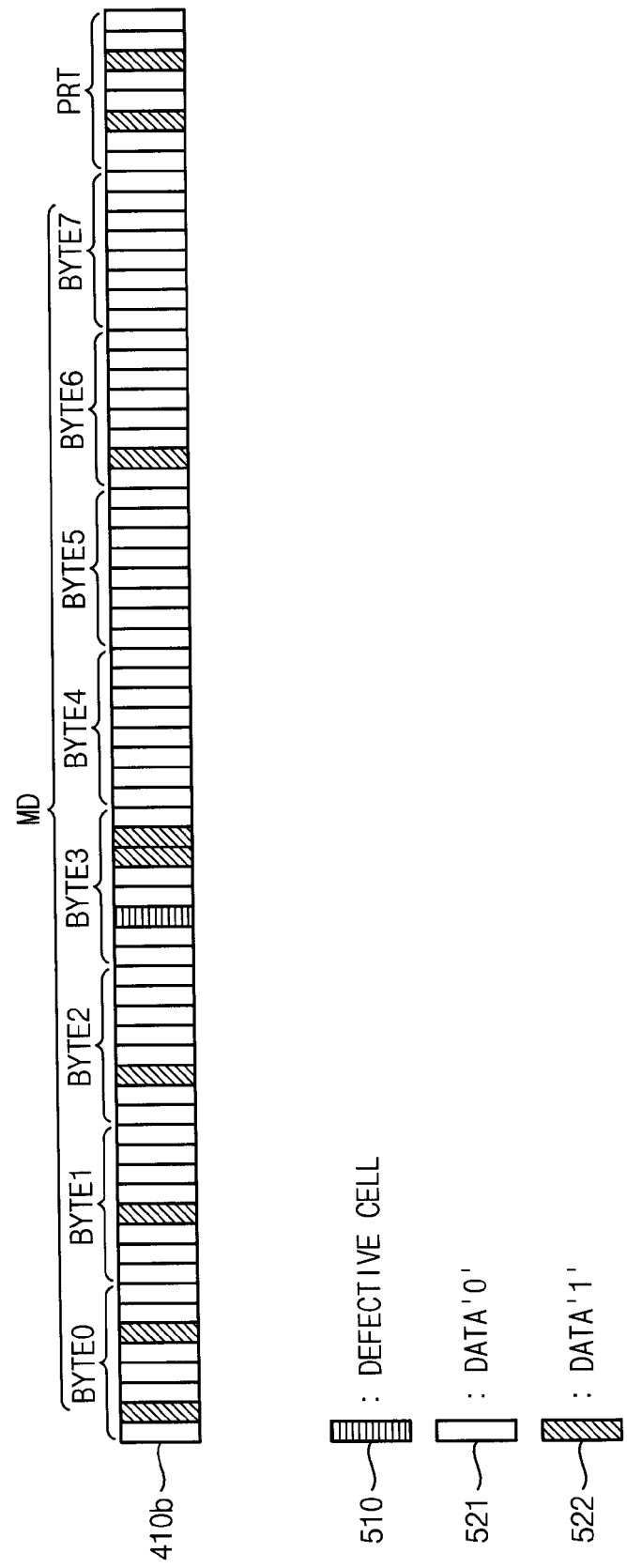
FIG. 6 illustrates a state of a target page after the semiconductor memory device is initialized and before the write operation is performed.

FIG. 6 illustrates a state of a target page after the semiconductor memory device is initialized and before the write operation is performed.

Referring to FIG. 6, a target page 410b on which the write operation to be performed includes a plurality of unit data BYTE0~BYTE7 and parity data PRT. In FIG. 6, a reference numeral 521 denotes a low-level data (or data '0' or a memory cell in which data '0' is stored) and a reference numeral 522 denotes a high-level data (or data '1' or a memory cell in which data '1' is stored). The initial data that is stored in the target page 410b indicates data that is randomly stored in the memory cell array. A reference numeral 510 denotes a defective cell including at least one error in a fourth unit data BYTE3.

Figure 7:
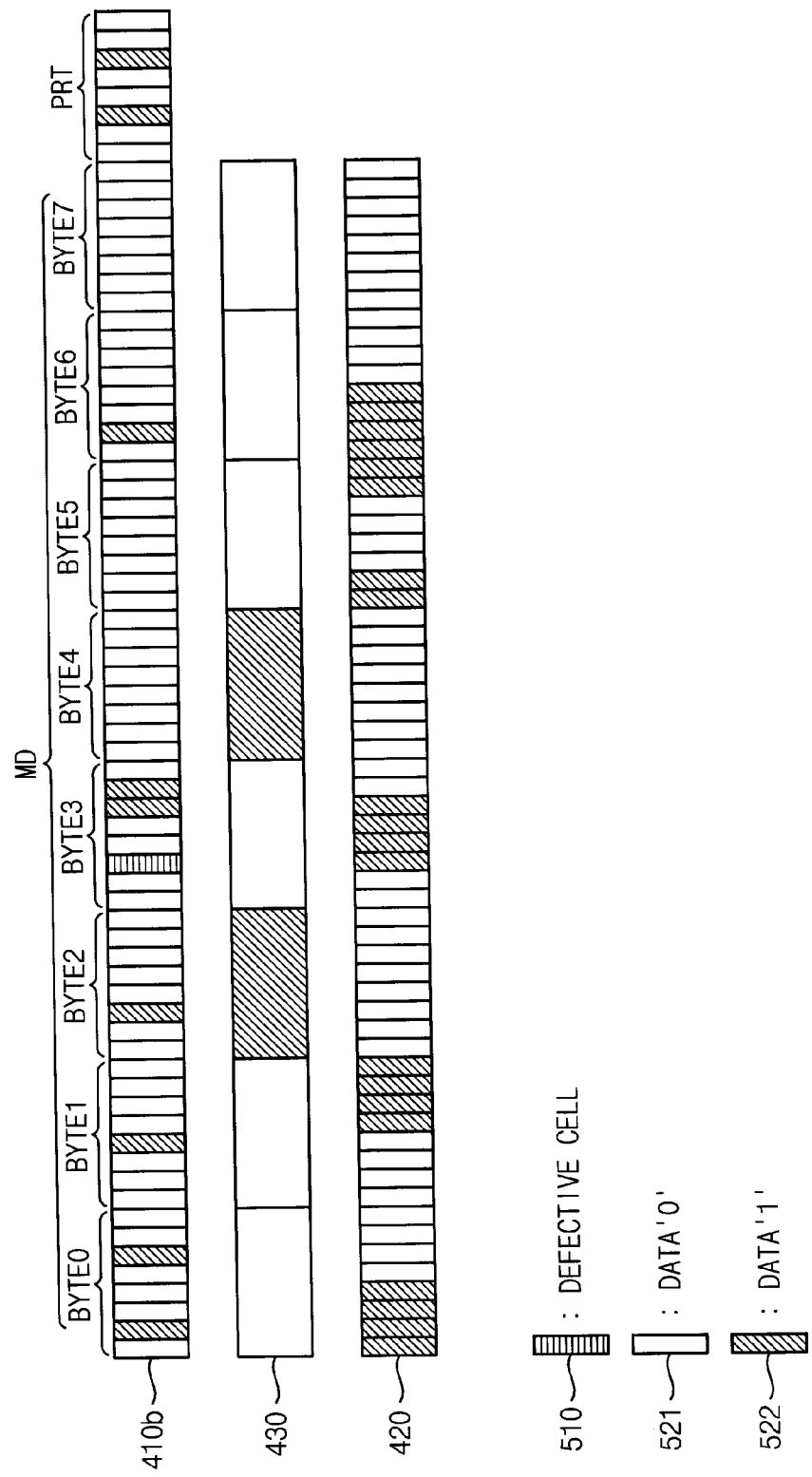
FIG. 7 illustrates data to be written in the memory cell array of the semiconductor memory device.

FIG. 7 illustrates data to be written in the memory cell array of the semiconductor memory device.

FIG. 7 illustrates first main data (MD) 420 and the data mask signal (DM) 430 provided to the data I/O buffer 299 when the semiconductor memory device 200a performs the masked write operation. The data I/O buffer 299 provides the main data 420 to the ECC circuit 300a and provides the data mask signal DM to the I/O gating circuit 290a.

Referring to FIG. 7, the masked write operation is to be performed in response to the data mask signal DM in which unit data BYTE0, BYTE1, BYTE3 and BYTE5~BYTE7 are to be written to the memory cell array and unit data BYTE2 and BYTE4 are not to be written in the memory cell array. In one embodiment, the data mask signal may have a logic high level (shown by shading in the above figures) when unit data should be masked. For example, the data mask signal may be sampled coincident with a write access, and sampling a data high level indicates to mask the data. As will be appreciated, the data mask timing matches the data bit timings.

Figure 8:
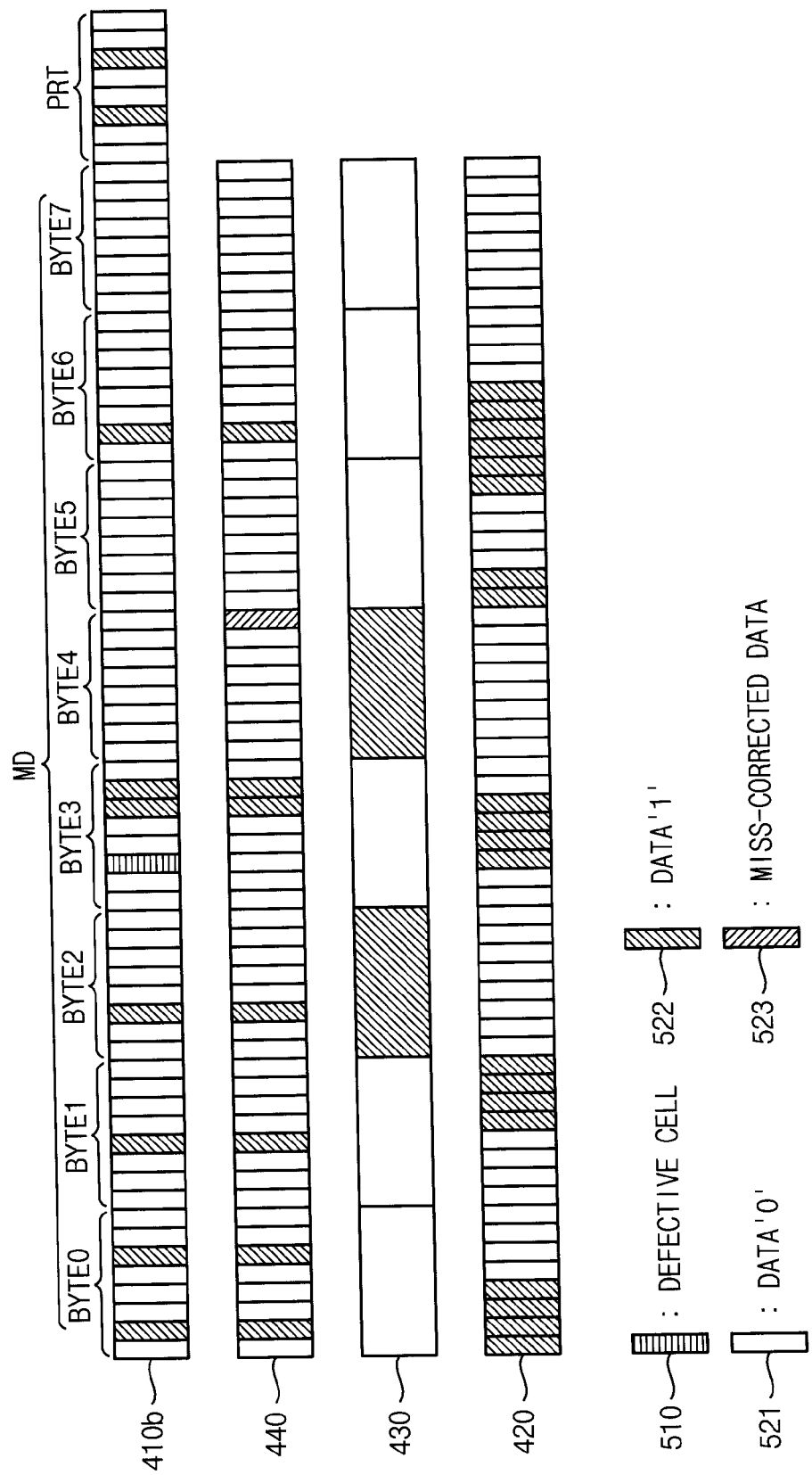
FIG. 8 illustrates that the initial data are read and errors in the initial data are corrected in the semiconductor memory device.

FIG. 8 illustrates that the initial data are read and errors in the initial data are corrected in the semiconductor memory device.

Referring to FIG. 8, when the masked write operation is performed, the latch unit 294a provides the decoder 320a with the initial data that is stored in the memory cell array in response to the mode signal MS and the decoded column address DCADDR, and the decoder 320a corrects the errors in the initial data using initial parity data that is stored in the memory cell array to provide the corrected initial data 440 to the encoder 310a. In this case, the corrected initial data 440 may include mis-corrected data denoted by a reference numeral 523.

Figure 9:
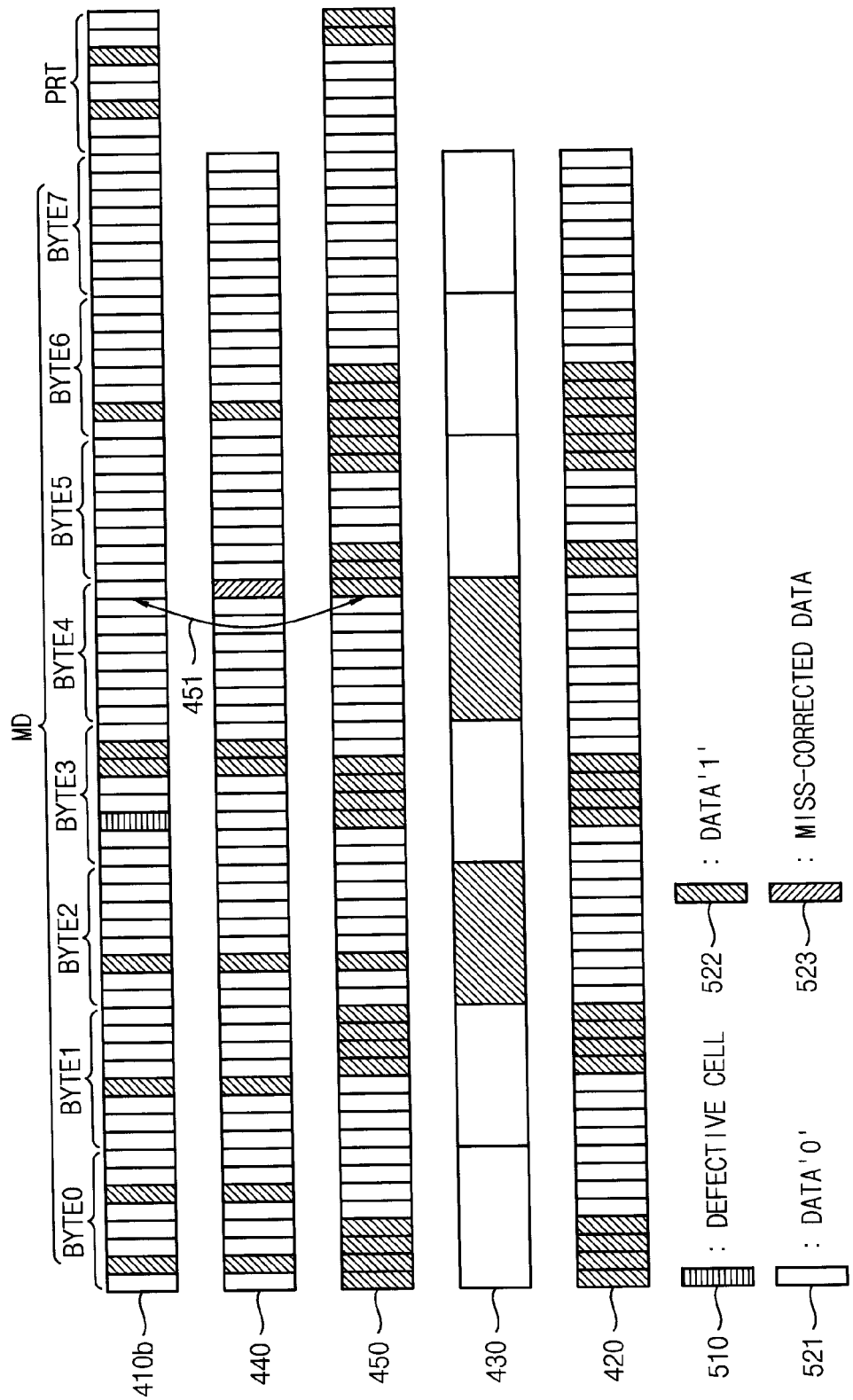
FIG. 9 illustrates that the write main data are encoded in the semiconductor memory device according to some example embodiment.

FIG. 9 illustrates that the write main data are encoded in the semiconductor memory device according to some example embodiment.

Referring FIG. 9, the encoder 310a generates the parity data PRT using corresponding unit data of the write main data for unit data not to be masked and corresponding unit data of the corrected initial data for unit data to be masked and provides the write driver 293a with the write codeword 450 including a combination of the main data and the corrected initial data and the parity data. The data mask signal DM for third and fifth unit data BYTE2 and BYTE4 of the write codeword 450 is high level. A reference numeral 451 indicates the data bit of the BYTE4 written to the memory cell array as a result of the error correction performed on the initial read data.

Figure 10:
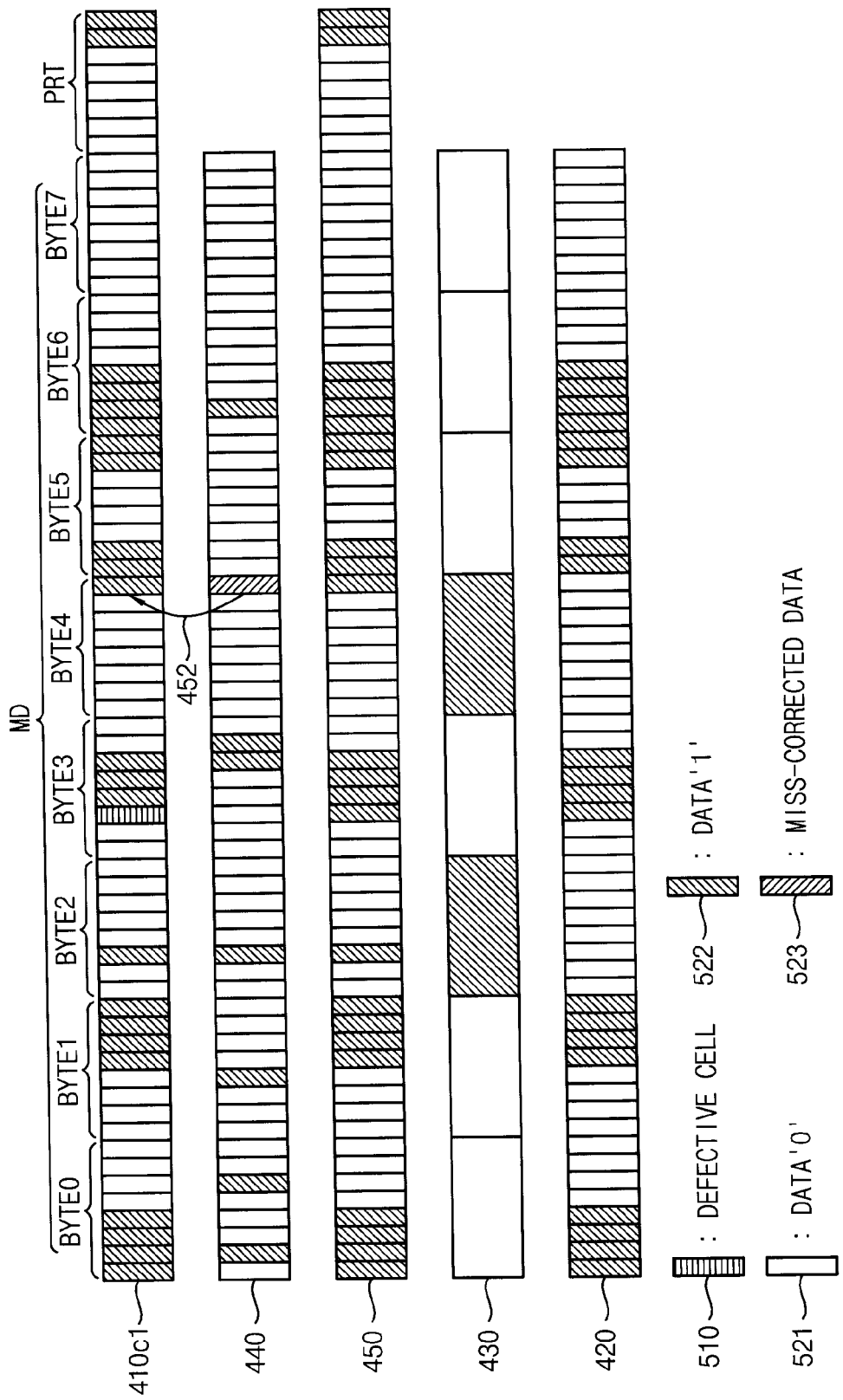
FIG. 10 illustrates that the masked write operation is performed in the semiconductor memory device according to some example embodiments.

FIG. 10 illustrates the masked write operation as performed in the semiconductor memory device according to some example embodiments.

Referring to FIG. 10, in the semiconductor memory device 200a, when the write driver 293a performs the masked write operation, the write driver 293a writes corresponding unit data of the main data MD for the unit data BYTE0, BYTE1, BYTE3 and BYTE5~BYTE7 not masked to the target page of the memory cell array and rewrites corresponding unit data of the corrected initial data for unit data BYTE2 and BYTE4, which are masked. That is, the corrected initial data are rewritten in regions corresponding to the unit data BYTE2 and BYTE4 being masked. Therefore, the target page 410c1 may include the corrected initial data cell 524 after the masked write operation is performed. Therefore, the target page includes the defective cell 510 after the write operation is performed and a number of errors in the target page does not exceed a number of errors that are correctable by the parity data PRT.

Therefore, according to the semiconductor memory device 200a, corresponding unit data of the corrected initial data for the unit data to be masked is rewritten in the memory cell array, and thus a number of errors in one codeword may be controlled under the error correction capability of the ECC circuit 300a, and the ECC circuit 300a may handle an increased bit error rate.

Figure 11:
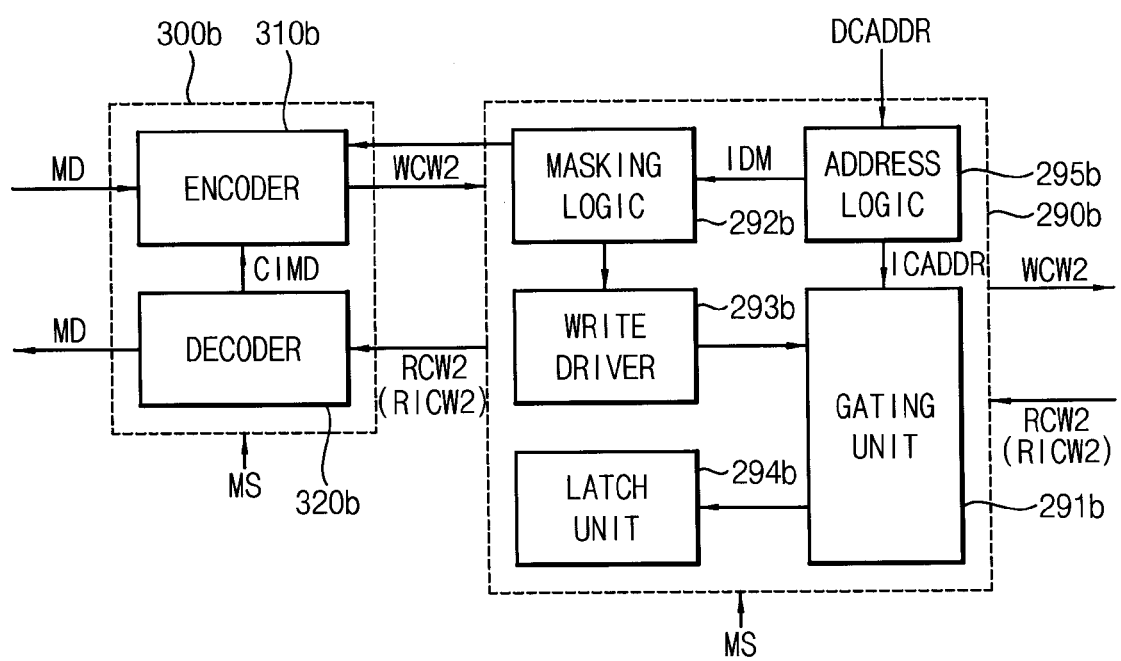
FIG. 11 is a block diagram illustrating an example of the ECC circuit and the I/O gating circuit in FIG. 3 according to an example embodiment.

FIG. 11 is a block diagram illustrating an example of the ECC circuit and the I/O gating circuit in FIG. 3 according to an example embodiment.

Figure 12:
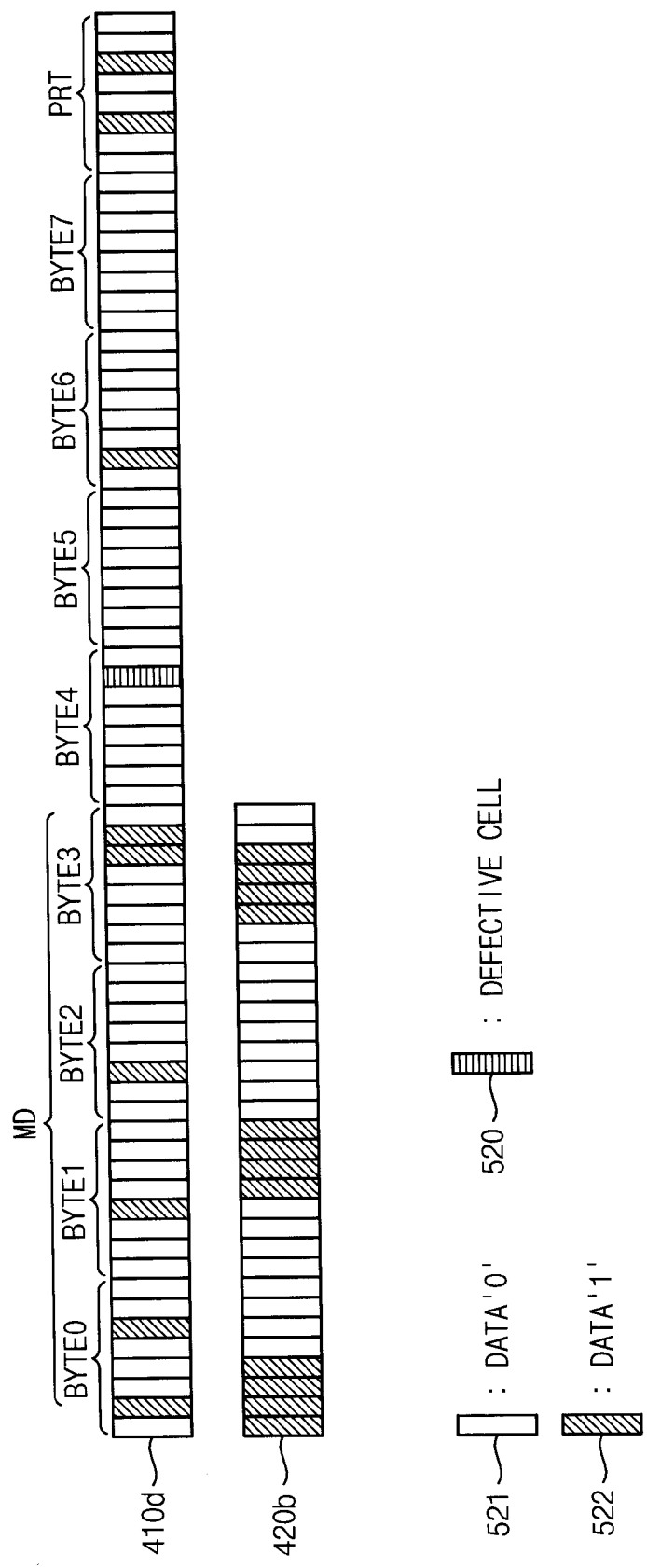
FIG. 12 illustrates a state of a target page before the partial write operation is performed and a main data to be written in the memory cell array.

Referring to FIG. 12, an ECC circuit 300b includes an encoder 310b and a decoder 320b. An I/O gating circuit 290b includes a write driver 293b, a mask logic 292b, an address logic 295b, a gating unit 291b and a latch unit 294b.

The encoder 310b receives the main data MD, encodes the main data MD to generate parity data and provides the I/O gating circuit 290b with a codeword (or write codeword) WCW2 including the main data MD and the parity data in a write operation.

The decoder 320b receives a read codeword RCW2 from the I/O gating circuit 290b, corrects errors in the codeword (or read codeword) RCW2 using parity data included in the codeword RCW2 and provides error-corrected main data MD to the memory controller 100 through the data I/O buffer 299 in a read operation. In addition, the decoder 320b receives from the I/O gating circuit 290b initial codeword RICW2 that is randomly stored in the memory cell array, corrects errors in the initial codeword RICW2 and provides corrected initial data CIMD to the encoder 310b when the mode signal MS indicates the partial updating operation including a partial write operation.

When the mode signal MS indicates the partial write operation in which a size of the main data (first main data) MD is smaller than a size of a main data (second main data) in the codeword RCW2, the encoder 310b receives the data mask signal (described below) from the I/O gating circuit 290b, and receives from the decoder 320b the corrected initial data CIMD corresponding to the size of the second main data. The encoder 310b generates parity data based on the main data MD (or first main data), the corrected initial data CIMD and the data mask information; and provides the I/O gating circuit 290b with a combination of the main data MD and the corrected initial data CIMD (or second main data) and the parity data. That is, when the mode signal MS indicates the partial write operation, the encoder 310b receives the first main data MD including a plurality of unit data, generates the second main data and the parity data using the first main data MD and the corrected initial data CIMD. When the encoder 310b generates the parity data, the encoder 310b uses the first main data MD and the corrected initial data CIMD, a bit number of the parity data is greater than a bit number of parity data of a case when the encoder 310b generates the parity data using the first main data MD. Therefore, the error correction capability of the ECC circuit 300b may be enhanced.

When the mode signal MS indicates the partial write operation, the address logic 295b generates an internal data mask signal IDM and an internal address signal ICADDR based on the decoded column address (or external address) DCADDR. The address logic 295b provides the internal data mask signal IDM to the mask logic 292b and provides the internal address signal ICADDR to the gating unit 291b. The address logic 295b may generate the internal address signal ICADDR by omitting at least one least significant bit (LSB) of the decoded column address DCADDR. Therefore, a data size designated by the internal address signal ICADDR may be double a data size designated by the decoded column address DCADDR.

The gating unit 291b gates the write codeword to the memory cell array and gates the read codeword from the memory cell array to the latch unit 294b in response to the internal address signal ICADDR. The mask logic 292b provides the data mask signal IDM to the encoder 310b, and controls the write driver 293b to perform the partial write operation in response to the internal data mask signal IDM. When the mode signal MS indicates the partial write operation, the latch unit 294b provides the decoder 320b with the initial data (or initial codeword) RICW2 that is stored in the memory cell array.

When the write driver 293b performs the partial write operation on the write codeword WCW2 under control of the mask logic 292b, the write driver 293b writes to the memory cell array corresponding unit data of the main data MD for the unit data to be updated (written) and rewrites to the memory cell array corresponding unit data of the corrected initial data CIMD for the unit data not to be updated (written).

Accordingly, compared with a case in which the parity data is generated using only the first main data MD, the error correction capability of the ECC circuit 300b may be enhanced by the encoder 310b generating the parity data using the first main data MD and the corrected initial data CIMD. In addition, corresponding unit data of the corrected initial data for the unit data not to be updated is rewritten in the memory cell array, and thus a number of errors in one codeword may be controlled under the error correction capability of the ECC circuit 300a, and the ECC circuit 300a may handle an increased bit error rate.

FIG. 12 illustrates a state of a target page before the partial write operation is performed and a main data to be written in the memory cell array.

Referring to FIG. 12, a target page 410d on which the write operation to be performed includes a data region in which a plurality of unit data BYTE0~BYTE7 is to be stored and a parity region in which parity data PRT is to be stored. In FIG. 12, a reference numeral 521 denotes a low-level data (or data '0' or a memory cell in which data '0' is stored) and a reference numeral 522 denotes a high-level data (or data '1' or a memory cell in which data '1' is stored). The initial data that is stored in the target page 410d indicates data that is randomly stored in the memory cell array. A reference numeral 510 denotes a defective cell including at least one error in a fifth unit data BYTE4. In addition, main data (MD) 420b provided to the data I/O buffer 299 is also illustrated when the semiconductor memory device 200a performs the partial write operation.

Figure 13:
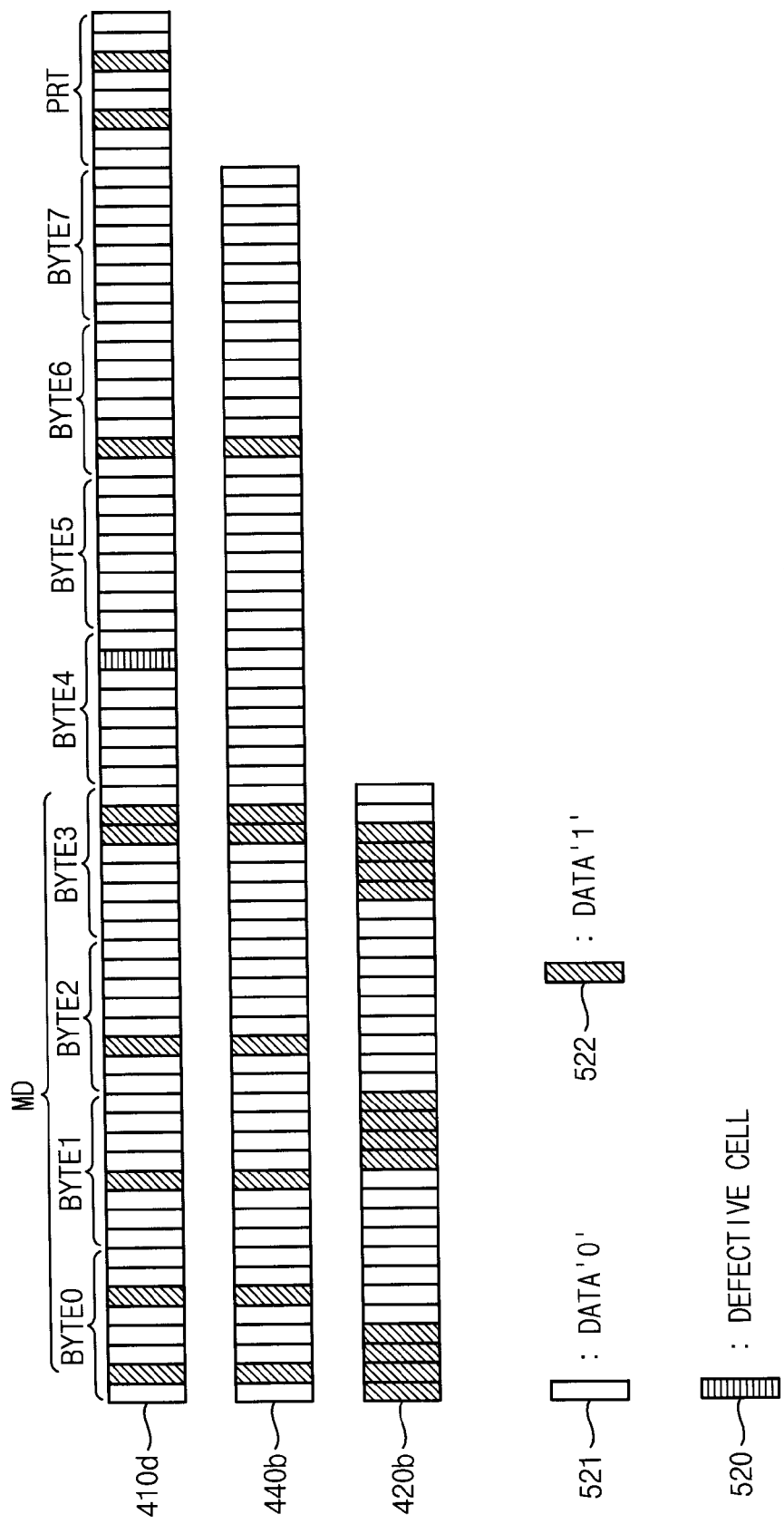
FIG. 13 illustrates that the initial data are read and errors in the initial data are corrected in the semiconductor memory device.

FIG. 13 illustrates that the initial data are read and errors in the initial data are corrected in the semiconductor memory device.

Referring to FIG. 13, when the partial write operation is performed, the gating unit 291b provides the latch unit 294b with the initial data that is stored in the memory cell array in response to the mode signal MS and the internal address signal ICADDR, the latch unit 294b provides the initial data to the decoder 320b, and the decoder 320b corrects the errors in the initial data using initial parity data that is stored in the memory cell array to provide the corrected initial data 440b to the encoder 310b. That is, the decoder 320b corrects the error in the defective cell 520, and the decoder 320b provides the corrected initial data 440b to the encoder 310b.

Figure 14:
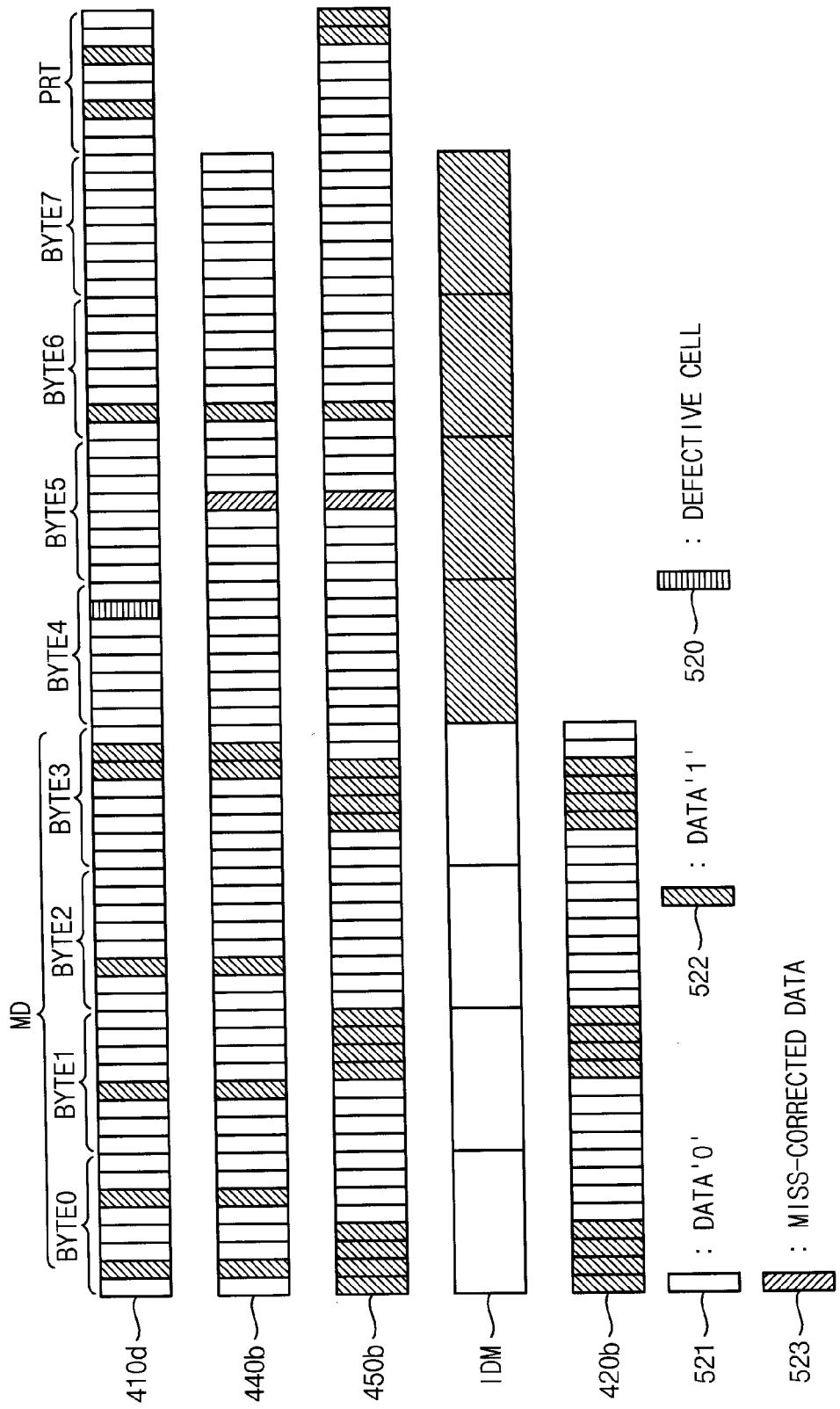
FIG. 14 illustrates that the write main data are encoded in the semiconductor memory device according to some example embodiment.

FIG. 14 illustrates that the write main data are encoded in the semiconductor memory device according to some example embodiment.

Referring to FIG. 14, the encoder 310b generates the parity data PRT using corresponding unit data of the write main data for unit data to be updated and corresponding unit data of the corrected initial data for unit data not to be masked and provides the write driver 293b with the write codeword 450b including combination of the main data and the corrected initial data and the parity data. The first through fourth unit data BYTE0~BYTE3 of the write codeword 450b correspond to the main data 420b and the fifth through eighth unit data BYTE4~BYTE7 of the write codeword 450b correspond to the corrected initial data. Each internal data mask signal IDM for the first through fourth unit data BYTE0~BYTE3 of the write codeword 450b is low level and each internal data mask signal IDM for the fifth through eighth unit data BYTE4~BYTE7 of the write codeword 450b is high level. In one embodiment, the internal data mask signal may have a logic high level (shown by shading in the above figures) when unit data should be masked. For example, the internal data mask signal may be sampled coincident with a write access, and sampling a data high level indicates to mask the data. As will be appreciated, the internal data mask timing matches the data bit timings.

Figure 15:
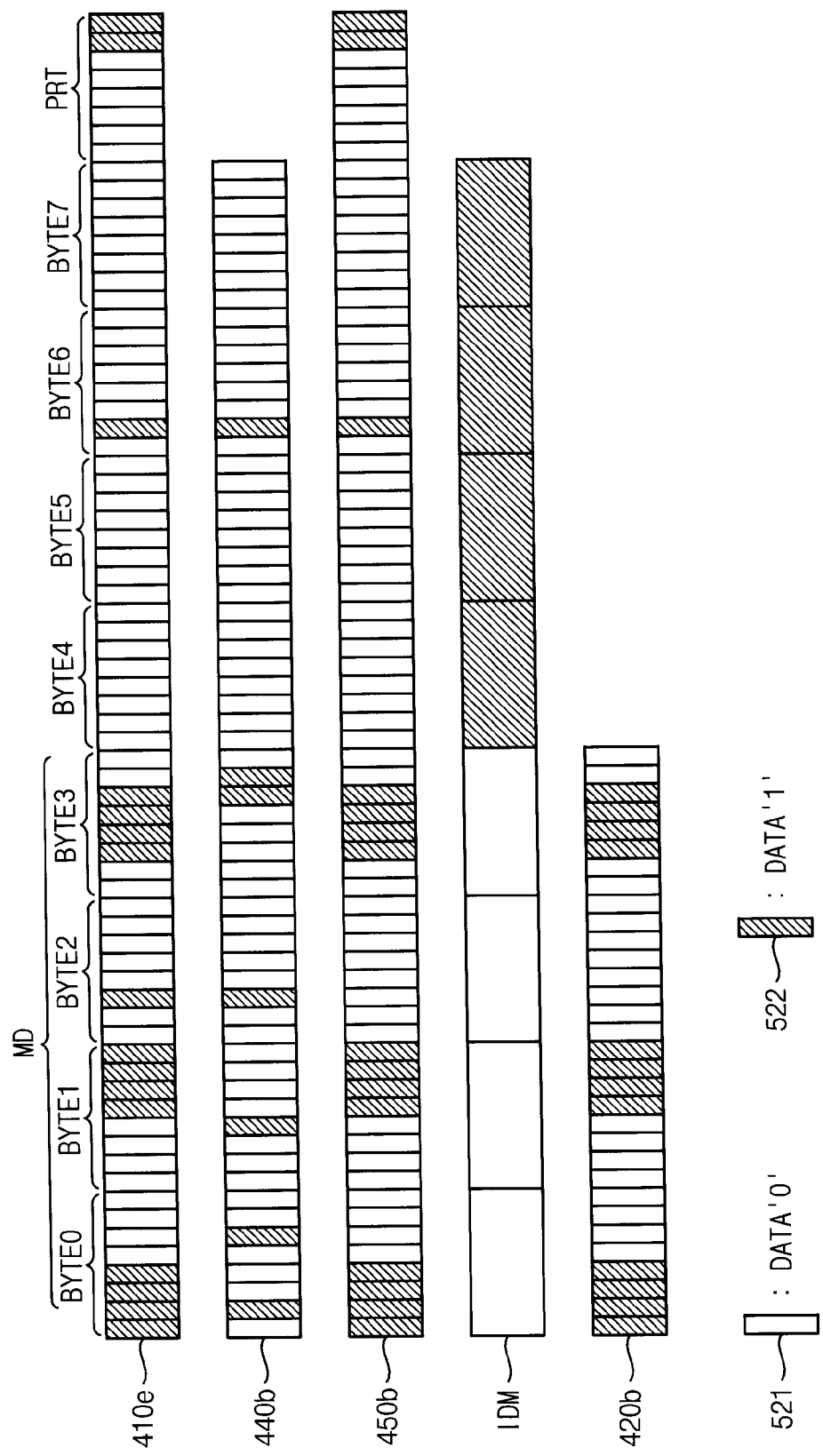
FIG. 15 illustrates that the masked write operation is performed in the semiconductor memory device according to some example embodiments.

FIG. 15 illustrates the masked write operation performed in the semiconductor memory device according to some example embodiments.

Referring to FIG. 15, in the semiconductor memory device 200a, when the write driver 293b performs the partial write operation, the write driver 293b writes corresponding unit data of the main data MD for the unit data BYTE0~BYTE3 to be updated to the target page of the memory cell array and rewrites corresponding unit data of the corrected initial data for unit data BYTE4~BYTE7 not to be updated. That is, the corrected initial data are rewritten in regions corresponding to the unit data BYTE4~BYTE7 to be masked by the internal data mask signal IDM. When a size of the main data 420b is smaller than a size of the main data in the write codeword 450b, the error correction capability of the ECC circuit 300b may be enhanced by generating the parity data PRT using the main data 420b and some of the corrected initial data BYTE4~BYTE7.

Figure 16:
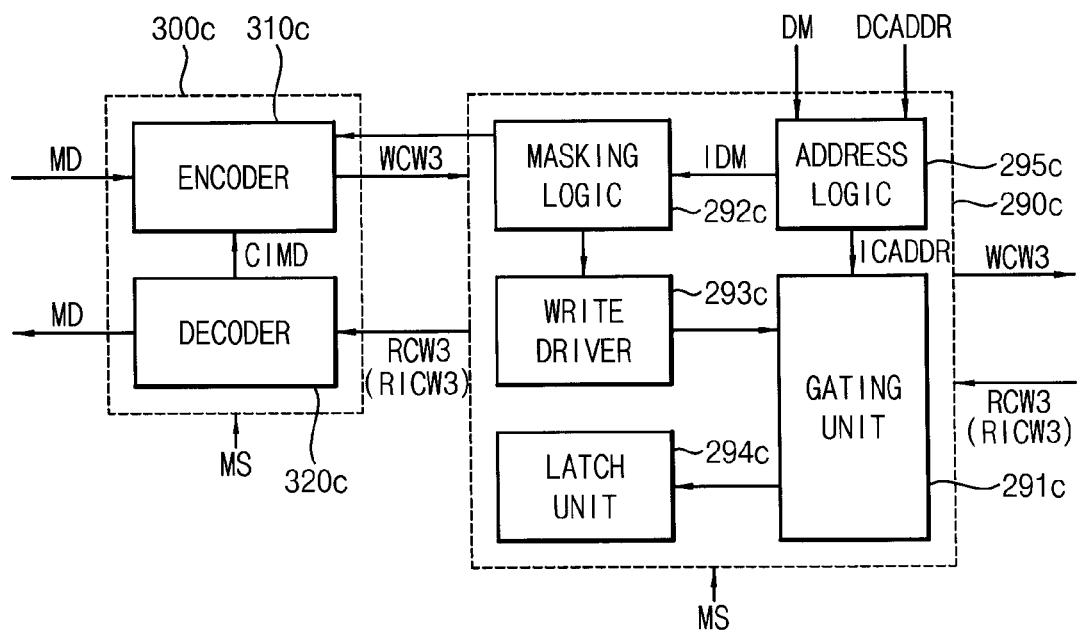
FIG. 16 is a block diagram illustrating an example of the ECC circuit and the I/O gating circuit in FIG. 3 according to an example embodiment.

FIG. 16 is a block diagram illustrating an example of the ECC circuit and the I/O gating circuit in FIG. 3 according to an example embodiment.

Referring to FIG. 16, an ECC circuit 300c includes an encoder 310c and a decoder 320c. An I/O gating circuit 290c includes a write driver 293c, a mask logic 292c, an address logic 295c, a gating unit 291c and a latch unit 294c.

The encoder 310c receives the main data MD, encodes the main data MD to generate parity data and provides the I/O gating circuit 290c with a codeword (or write codeword) WCW2 including the main data MD and the parity data in a write operation.

The decoder 320c receives a codeword RCW3 from the I/O gating circuit 290c, corrects errors in the codeword (or read codeword) RCW3 using parity data included in the codeword RCW3 and provides error-corrected main data MD to the memory controller 100 through the data I/O buffer 299 in a read operation. In addition, the decoder 320c receives from the I/O gating circuit 290c an initial codeword RICW3 that is randomly stored in the memory cell array, corrects errors in the initial codeword RICW2 and provides corrected initial data CIMD to the encoder 310c when the mode signal MS indicates the partial updating operation.

When the mode signal MS indicates the masked write operation and the partial write operation in which a size of the main data (first main data) MD is smaller than a size of main data (second main data) in the codeword RCW3, the encoder 310c receives the mask data signal IDM from the I/O gating circuit 290c and receives from the decoder 320c the corrected initial data CIMD corresponding to the size of the second main data. The encoder 310c generates parity data based on the main data MD (or first main data) and the corrected initial data CIMD and provides the I/O gating circuit 290c with a combination of the main data MD and the corrected initial data CIMD (or second main data) and the parity data. That is, when the mode signal MS indicates the partial updating operation, the encoder 310c receives the first main data MD including a plurality of unit data, generates the second main data and the parity data using the first main data MD and the corrected initial data CIMD. When the encoder 310c generates the parity data, the encoder 310c uses the first main data MD and the corrected initial data CIMD, a bit number of the parity data is greater than a bit number of parity data of a case when the encoder 310c generates the parity data using the first main data MD. Therefore, the error correction capability of the ECC circuit 300c may be enhanced.

When the mode signal MS indicates the partial updating operation, the address logic 295c generates an internal data mask signal IDM and an internal address signal ICADDR based on the decoded column address (or external address) DCADDR and the data mask signal DM. The address logic 295c provides the internal data mask signal IDM to the mask logic 292c and provides the internal address signal ICADDR to the gating unit 291c. The address logic 295c may generate the internal address signal ICADDR by omitting at least one least significant bit (LSB) of the decoded column address DCADDR. Therefore, a data size designated by the internal address signal ICADDR may be double a data size designated by the decoded column address DCADDR.

The gating unit 291c gates the write codeword to the memory cell array and gates the read codeword from the memory cell array to the latch unit 294c in response to the internal address signal ICADDR. The mask logic 292c provides the data mask signal IDM to the encoder 310c and controls the write driver 293c to perform the partial updating operation in response to the internal data mask signal IDM. When the mode signal MS indicates the partial updating operation, the latch unit 294c provides the decoder 320c with the initial data (or initial codeword) RICW3 that is stored in the memory cell array.

When the write driver 293c performs the partial write operation on the write codeword WCW3 under control of the mask logic 292c, the write driver 293c writes to the memory cell array corresponding unit data of the main data MD for the unit data to be updated and not to be masked and rewrites to the memory cell array corresponding unit data of the corrected initial data CIMD for the unit data not to be updated (written) and to be masked.

Accordingly, compared with a case in which the parity data is generated using only the first main data MD, the error correction capability of the ECC circuit 300c may be enhanced by the encoder 310c generating the parity data using the first main data MD and the corrected initial data CIMD. In addition, corresponding unit data of the corrected initial data for the unit data not to be updated and to be masked is rewritten in the memory cell array, and thus a number of errors in one codeword may be controlled under the error correction capability of the ECC circuit 300c, and the ECC circuit 300c may handle an increased bit error rate.

Figure 17:
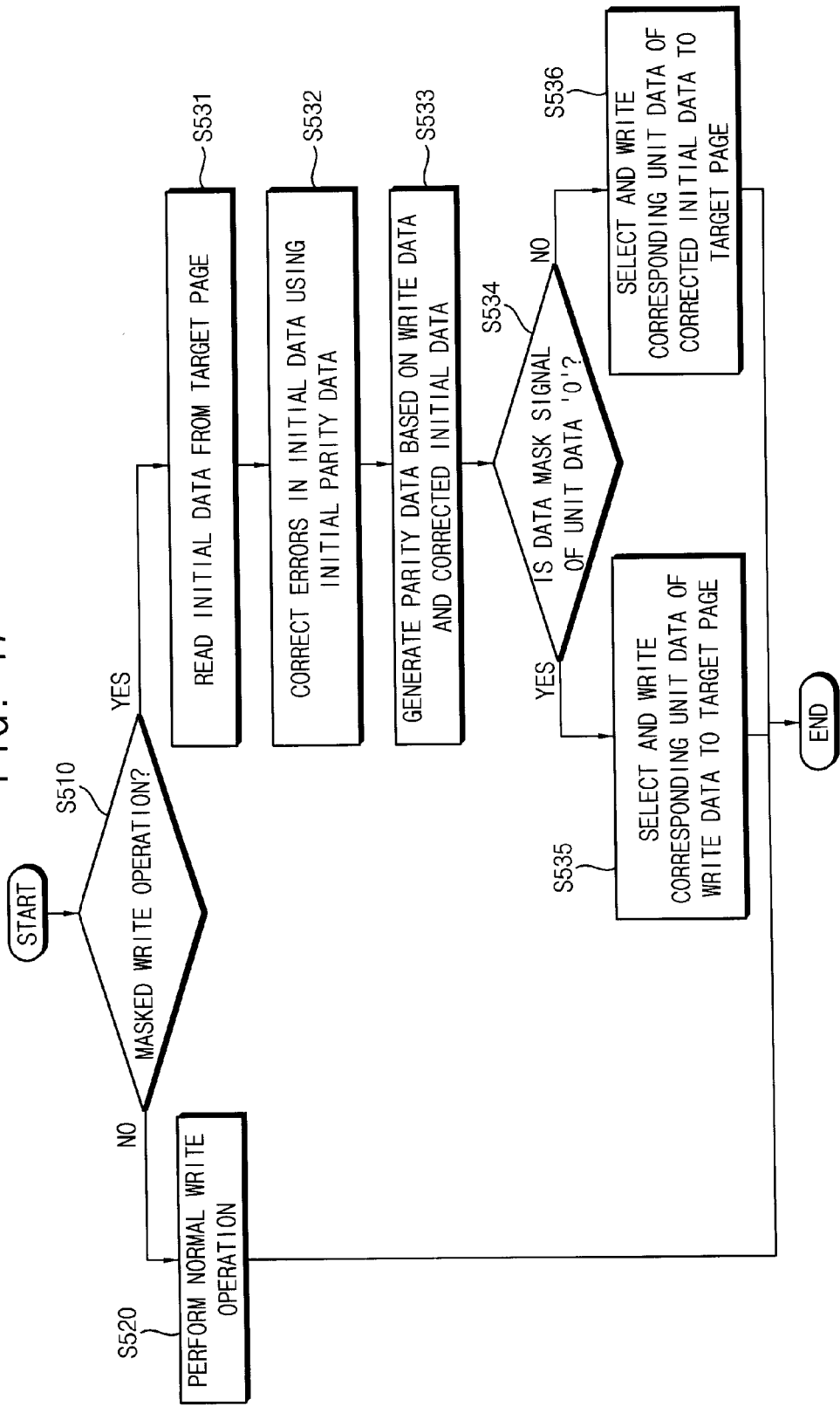
FIG. 17 is a flow chart illustrating a normal write operation in FIG. 18 according to some example embodiments.

FIG. 17 is a flow chart illustrating a method of writing data in a semiconductor memory device according to some example embodiments.

Referring to FIGS. 3 through 17, the semiconductor memory device 200a determines whether a write command (or a write operation) from the memory controller 100 is a masked write command or a normal write command (S510). In particular, the control logic 210 may determine whether the write command is a masked write command or a normal write command. The command may directly indicate the command is for masked write. Alternatively, a masked signal accompanying the command may indicate a masked write. Still further, a size of the main data being less than the size of codeword may indicate a masked write; wherein the mask signal is generated internally.

When the write command is a not masked write command (NO in S510), the I/O gating circuit 290 performs normal write operation.

When the write command is a masked write command (YES in S510), the I/O gating circuit 290 reads initial data (e.g., initially read codeword) from a target page (e.g., codeword location) and provides the initial data to the ECC circuit 300 (S531). The decoder 320a corrects errors in the initial data using initial parity data to provide a corrected read codeword or corrected initial data to the encoder 310a (S532). The encoder 310a generates parity data based on the main data and the corrected initial data and provides the I/O gating circuit 290a with a codeword including a combination of the main data, the corrected initial data and the parity data (S533). For each data unit in the codeword, the mask logic 292a determines whether the data mask signal DM for each unit data of the codeword is '0' (S534). When the data mask signal DM is '0' (YES in S534), the write driver 293a selects and writes corresponding unit data of the main data to the memory cell array under control of the mask logic 292a (S535). When the data mask signal DM is not '0' (NO in S534), the write driver 293a selects and rewrites corresponding unit data of the corrected initial data to the memory cell array under control of the mask logic 292a (S536).

Figure 18:
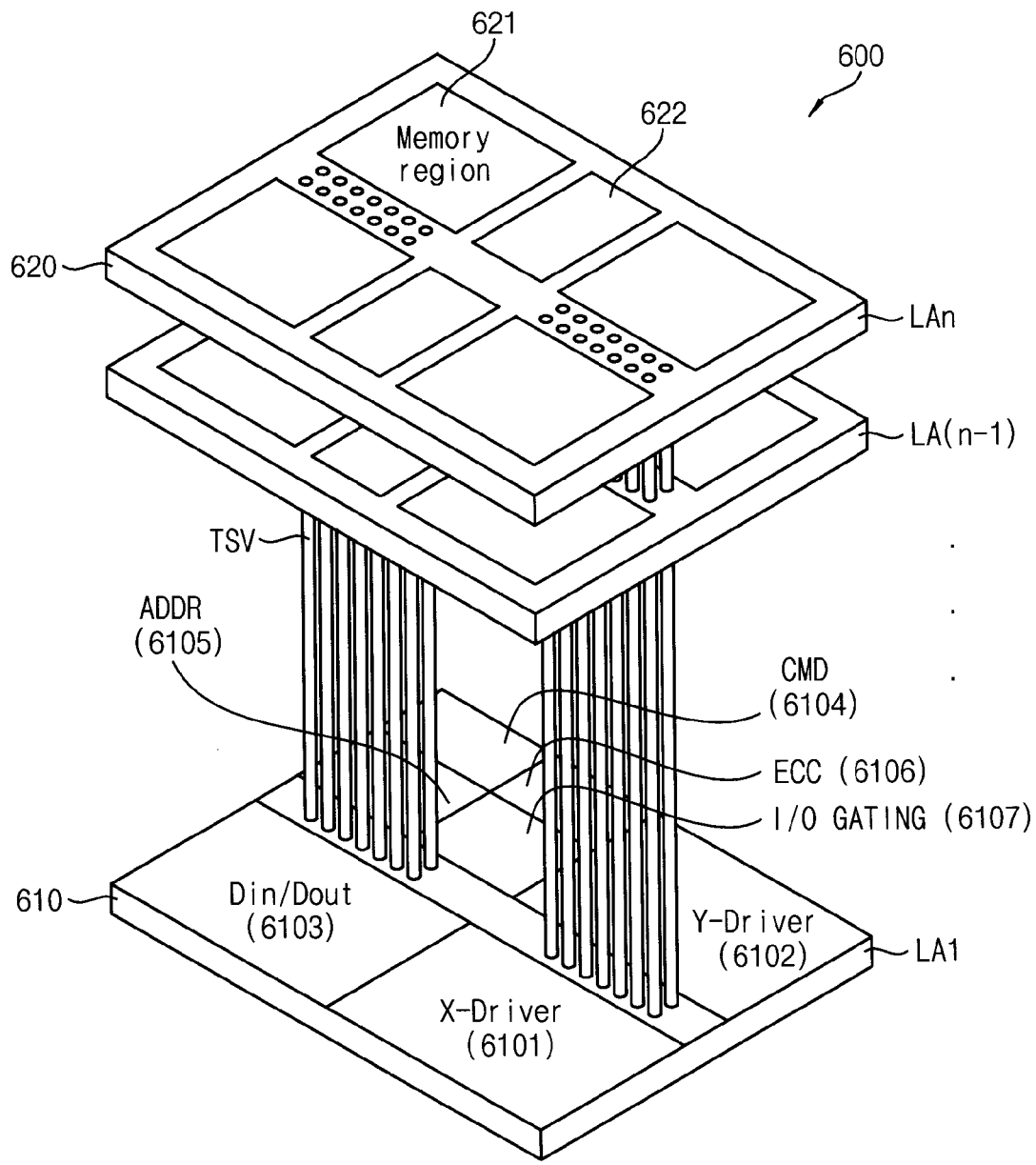
FIG. 18 is a structural diagram illustrating a semiconductor memory device according to some example embodiments.

FIG. 18 is a structural diagram illustrating a semiconductor memory device according to some example embodiments.

Referring to FIG. 18, a semiconductor memory device 600 may include a plurality of first through nth semiconductor integrated circuit layers LA1 through LAn, in which the lowest first semiconductor integrated circuit layer LA1 is assumed to be an interface or control chip and the other semiconductor integrated circuit layers LA2 through LAn are assumed to be slave chips, including core memory chips. The plurality of semiconductor integrated circuit layers LA1 through LAn transmit and receive signals therebetween using through-silicon-vias (TSVs). The lowest first semiconductor integrated circuit layer LA1 as the interface or control chip communicates with an external memory controller through a conductive structure formed on an external surface. A description will be made regarding the structure and operation of the semiconductor memory device 600 by mainly using the first semiconductor integrated circuit layer LA1 or 610 as the interface or control chip and the nth semiconductor integrated circuit layer LAn or 620 as the slave chip.

The first semiconductor integrated circuit layer 610 may include various peripheral circuits for driving memory regions 621 provided in the nth semiconductor integrated circuit layer 620. For example, the first semiconductor integrated circuit layer 610 may include a row (X)-driver 6101 for driving word lines of a memory, a column (Y)-driver 6102 for driving bit lines of the memory, a data input/output unit (Din/Dout) 6103 for controlling input/output of data, a command buffer (CMD) 6104 for receiving a command CMD from outside and buffering the command CMD, and an address buffer (ADDR) 6105 for receiving an address from outside and buffering the address.

The first semiconductor integrated circuit layer 610 may further include an ECC circuit 6106 for correcting errors in input/output data and an I/O gating circuit 6107 for performing partial updating operation including masked write operation and partial write operation according to the above described embodiments.

The nth semiconductor integrated circuit layer 620 may include the memory regions 621 including memory cell arrays and peripheral circuit regions 622 in which peripheral circuits for reading/writing data of the memory regions 621, e.g., a row decoder, a column decoder, a bit line sense amplifier, etc. (not illustrated) are arranged.

FIG. 91 is a block diagram illustrating a memory module including the semiconductor memory device according to some example embodiments.

Figure 19:
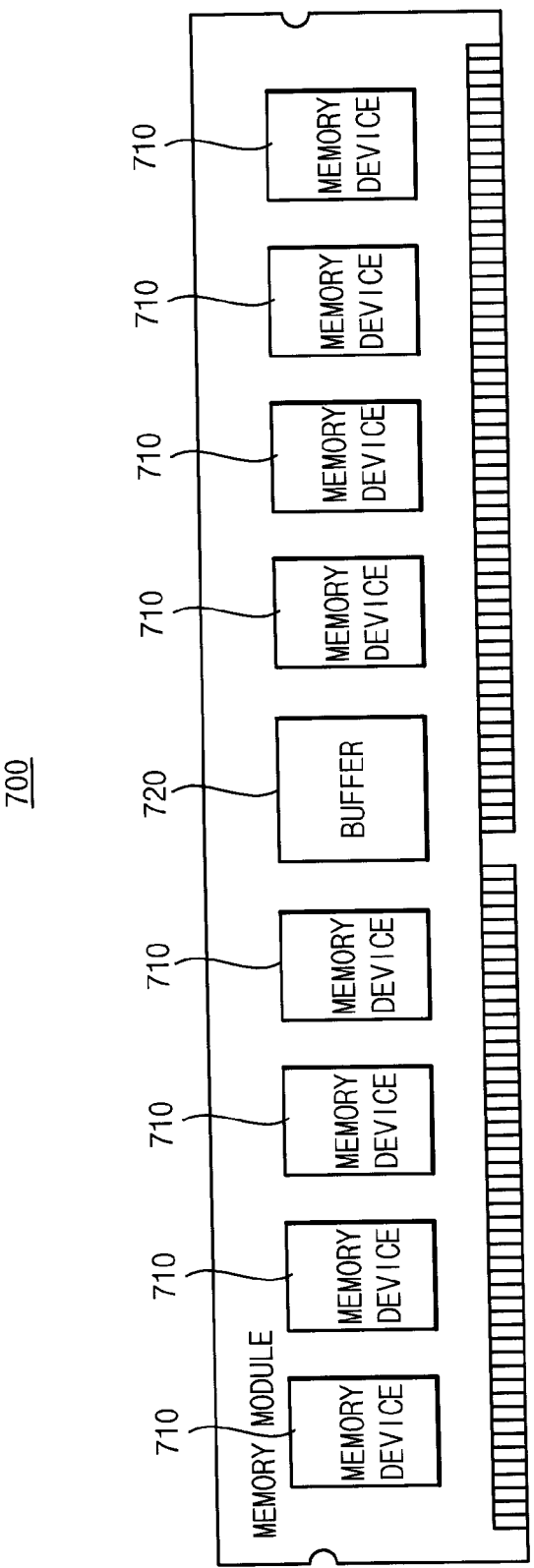
FIG. 19 is a block diagram illustrating a memory module including the semiconductor memory device according to some example embodiments.

Referring to FIG. 19, a memory module 700 may include a plurality of semiconductor memory devices 710. In some embodiments, the memory module 700 may be an unbuffered dual in-line memory module (UDIMM), a registered dual in-line memory module (RDIMM), a fully buffered dual in-line memory module (FBDIMM), a load reduced dual in-line memory module LRDIMM, etc.

The memory module 700 may further include a buffer 720 that provides a command/address signal and data by buffering the command/address signal and the data from a memory controller through a plurality of transmission lines. In some embodiments, data transmission lines between the buffer 720 and the semiconductor memory devices 710 may be coupled in a point-to-point topology, and command/address transmission lines between the buffer 720 and the semiconductor memory devices 710 may be coupled in a multi-drop topology, a daisy-chain topology, a fly-by daisy-chain topology, or the like. Since the buffer 720 buffers both the command/address signal and the data, the memory controller may interface with the memory module 700 by driving only a load of the buffer 720. Accordingly, the memory module 700 may include more semiconductor memory devices and/or more memory ranks, and a memory system may include more memory modules.

Each of the semiconductor memory devices 710 may employ the semiconductor memory device 200a of FIG. 3. Therefore, each of the semiconductor memory devices 710 reads initial data that is stored in a memory cell array for unit data to be masked or not to be updated, corrects errors in the initial data and rewrites the corrected initial data to the memory cell array when each of the semiconductor memory devices 710 performs a partial updating operation in response to at least one of a data mask signal or an internal address signal. Therefore, each of the semiconductor memory devices 710 may control a number of errors in one codeword under error correction capability of ECC circuit, and the ECC circuit may handle an increased bit error rate.

Figure 20:
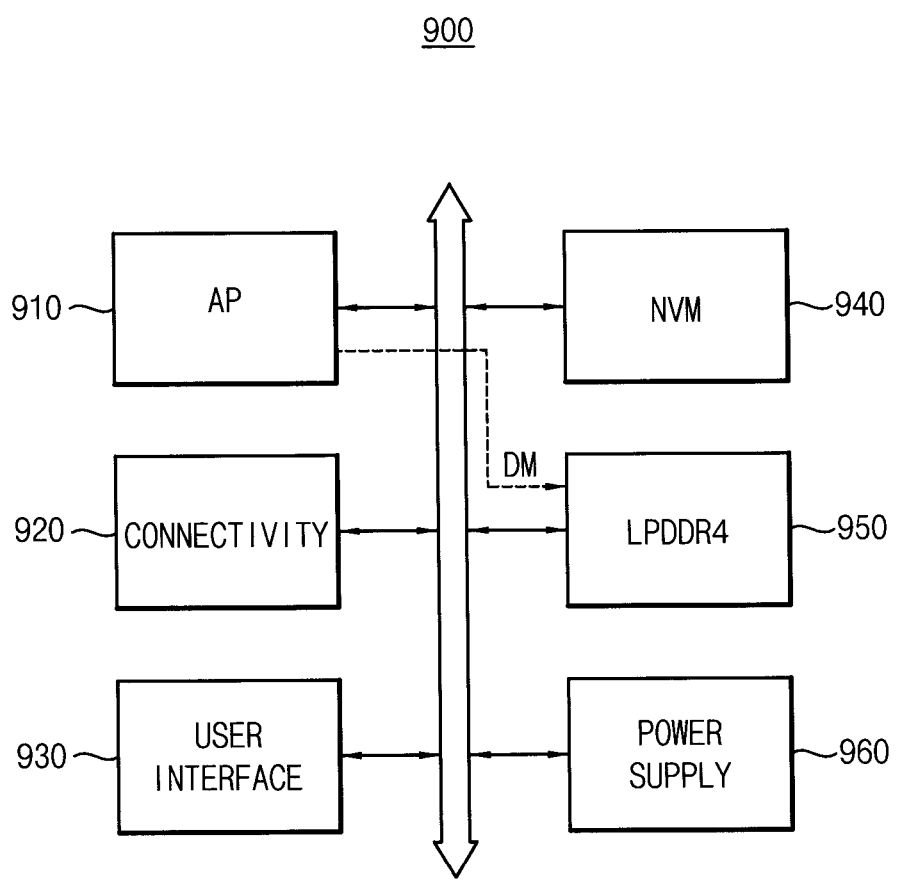
FIG. 20 is a block diagram illustrating a mobile system including the semiconductor memory device according to some example embodiments.

FIG. 20 is a block diagram illustrating a mobile system including the semiconductor memory device according to some example embodiments.

Referring to FIG. 20, a mobile system 900 includes an application processor 910, a connectivity unit 920, a semiconductor memory device (LPDDR4) 950, a nonvolatile memory device 940, a user interface 930 and a power supply 960. In some embodiments, the mobile system 900 may be a mobile phone, a smart phone, a personal digital assistant (PDA), a portable multimedia player (PMP), a digital camera, a music player, a portable game console, a navigation system, etc.

The application processor 910 may execute applications, such as a web browser, a game application, a video player, etc. In some embodiments, the application processor 910 may include a single core or multiple cores. For example, the application processor 910 may be a multi-core processor, such as a dual-core processor, a quad-core processor, a hexa-core processor, etc. The application processor 910 may include an internal or external cache memory. The application processor 910 may provide data mask signal DM to the semiconductor memory device 950.

The connectivity unit 920 may perform wired or wireless communication with an external device. For example, the connectivity unit 920 may perform Ethernet communication, near field communication (NFC), radio frequency identification (RFID) communication, mobile telecommunication, memory card communication, universal serial bus (USB) communication, etc. In some embodiments, connectivity unit 920 may include a baseband chipset that supports communications, such as global system for mobile communications (GSM), general packet radio service (GPRS), wideband code division multiple access (WCDMA), high speed downlink/uplink packet access (HSxPA), etc.

The semiconductor memory device 950 may employ the semiconductor memory device 200a of FIG. 3. Therefore, the semiconductor memory device 950 operate according to one of the example embodiments; and reads initial data that is stored in a memory cell array for unit data to be masked or not to be updated, corrects errors in the initial data and rewrites the corrected initial data to the memory cell array when the semiconductor memory devices 950 performs a partial updating operation in response to at least one of the data mask signal DM or an internal address signal. Therefore, the semiconductor memory device 950 may control a number of errors in one codeword under error correction capability of an ECC circuit included therein, and the ECC circuit may handle increased bit error rate.

The nonvolatile memory device 940 may store a boot image for booting the mobile system 900. For example, the nonvolatile memory device 940 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 930 may include at least one input device, such as a keypad, a touch screen, etc., and at least one output device, such as a speaker, a display device, etc. The power supply 960 may supply a power supply voltage to the mobile system 900. In some embodiments, the mobile system 900 may further include a camera image processor (CIS), and/or a storage device, such as a memory card, a solid state drive (SSD), a hard disk drive (HDD), a CD-ROM, etc.

In some embodiments, the mobile system 900 and/or components of the mobile system 900 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 21:
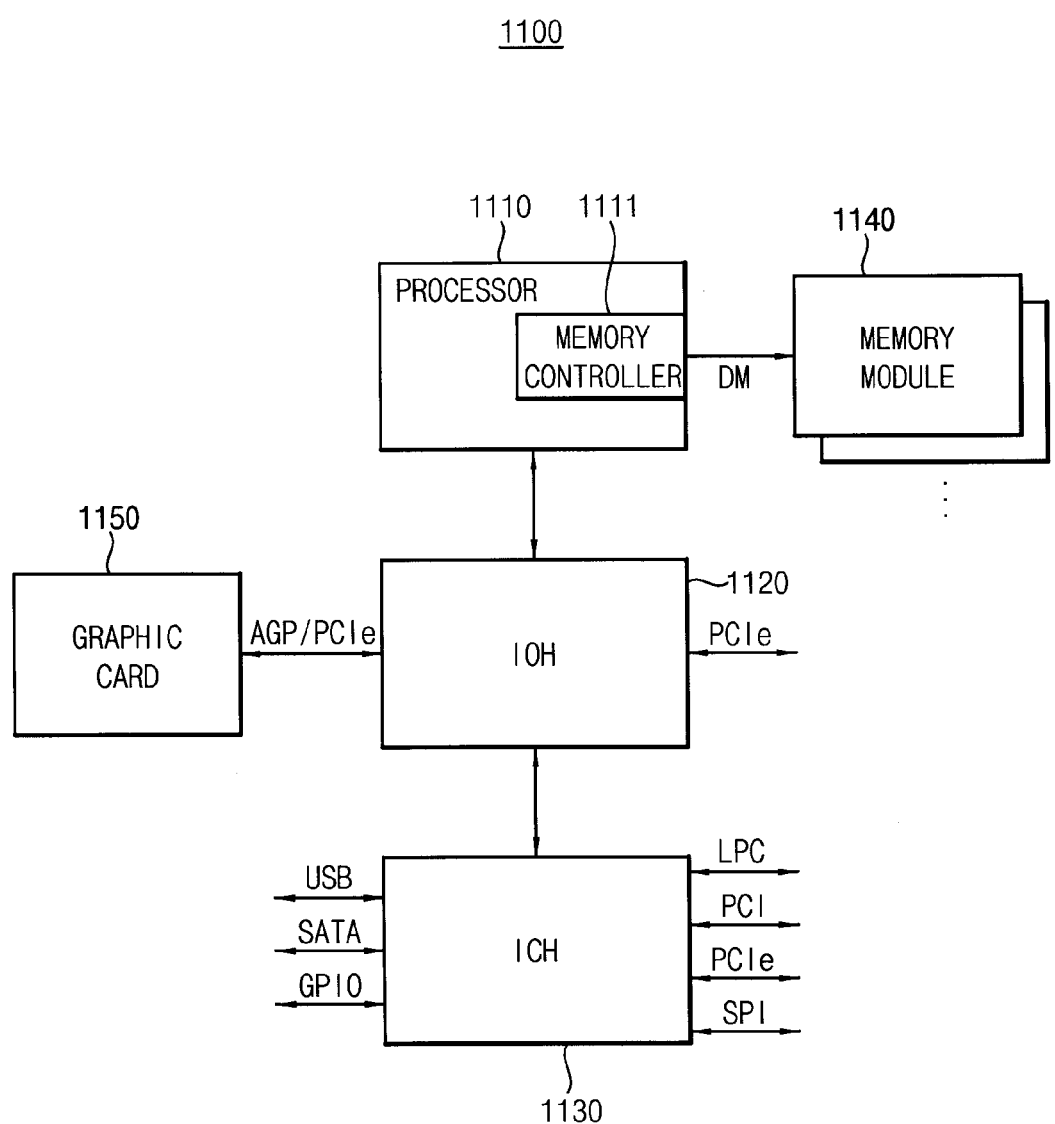
FIG. 21 is a block diagram illustrating a computing system according to some example embodiments.

FIG. 21 is a block diagram illustrating a computing system according to some example embodiments.

Referring to FIG. 21, a computing system 1100 includes a processor 1110, an input/output hub (IOH) 1120, an input/output controller hub (ICH) 1130, at least one memory module 1140 and a graphics card 1150. In some embodiments, the computing system 1100 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 1110 may perform various computing functions, such as executing specific software for performing specific calculations or tasks. For example, the processor 1110 may be a microprocessor, a central process unit (CPU), a digital signal processor, or the like. In some embodiments, the processor 1110 may include a single core or multiple cores. For example, the processor 1110 may be a multi-core processor, such as a dual-core processor, a quad-core processor, a hexa-core processor, etc. Although FIG. 23 illustrates the computing system 1100 including one processor 1110, in some embodiments, the computing system 1100 may include a plurality of processors. The processor 1110 may include an internal or external cache memory.

The processor 1110 may include a memory controller 1111 for controlling operations of the memory module 1140. The memory controller 1111 included in the processor 1110 may be referred to as an integrated memory controller (IMC). A memory interface between the memory controller 1111 and the memory module 1140 may be implemented with a single channel including a plurality of signal lines, or may bay be implemented with multiple channels, to each of which at least one memory module 1140 may be coupled. In some embodiments, the memory controller 1111 may be located inside the input/output hub 1120, which may be referred to as memory controller hub (MCH).

The memory module 1140 may include a plurality of semiconductor memory devices that store data provided from the memory controller 1111. The semiconductor memory devices may receive the data mask signal DM from the memory controller 1111. Each of the semiconductor memory devices may employ the semiconductor memory device 200a of FIG. 3. Therefore, each of the semiconductor memory devices reads initial data that is stored in a memory cell array for unit data to be masked or not to be updated, corrects errors in the initial data and rewrites the corrected initial data to the memory cell array when each of the semiconductor memory devices performs a partial updating operation in response to at least one of the data mask signal DM or an internal data mask signal IDM. Therefore, each of the semiconductor memory devices may control a number of errors in one codeword under error correction capability of ECC circuit, and the ECC circuit may handle an increased bit error rate.

The input/output hub 1120 may manage data transfer between processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a Hyper-Transport, a lightning data transport (LDT), a QuickPath interconnect (QPI), a common system interface (CSI), etc. Although FIG. 23 illustrates the computing system 1100 including one input/output hub 1120, in some embodiments, the computing system 1100 may include a plurality of input/output hubs. The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device (not shown) for displaying an image. The graphics card 1150 may include an internal processor for processing image data and an internal semiconductor memory device. In some embodiments, the input/output hub 1120 may include an internal graphics device along with or instead of the graphics card 1150 outside the graphics card 1150. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1110, the input/output hub 1120 and the input/output controller hub 1130 may be implemented as separate chipsets or separate integrated circuits. In other embodiments, at least two of the processor 1110, the input/output hub 1120 and the input/output controller hub 1130 may be implemented as a single chipset.

Figure 22:
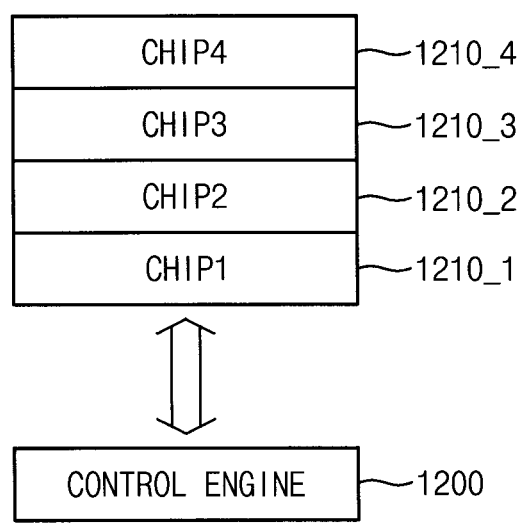
FIG. 22 is a block diagram illustrating a memory module including the semiconductor memory device according to some other example embodiments.

FIG. 22 is a block diagram illustrating a memory module including the semiconductor memory device according to some other example embodiments. As shown, the memory module includes a plurality of semiconductor chips 1210_1 to 1210_4. While four semiconductor chips are shown, the example embodiments are not limited to four semiconductor chips, instead more or less than four semiconductor chips may be included. Each of the semiconductor chips 1210 may include a memory device (e.g., DRAM) according to one of the above described embodiments. However, a control engine 1200 controls operation of the semiconductor chips 1210. More specifically, the control engine 1200 may include an ECC engine, etc. Accordingly, in one embodiment, the control engine 1200 may write and/or read a codeword to/from more than one of the semiconductor chips 1210. Stated another way, the semiconductor chips 1210 form the memory array, and different portions of a codeword may be written to and read from different ones of the semiconductor chips 1210.

As mentioned above, the semiconductor memory device reads initial data that is stored in a memory cell array for unit data to be masked or not to be updated, corrects errors in the initial data and rewrites the corrected initial data to the memory cell array when the semiconductor memory device performs a partial updating operation in response to at least one of a data mask signal or an internal address signal. Therefore, the semiconductor memory device may control a number of errors in one codeword under error correction capability of ECC circuit, and the ECC circuit may handle an increased bit error rate.

The present inventive concepts may be applied to systems using memory controllers and semiconductor memory devices. The present inventive concepts may be applied to systems such as be a mobile phone, a smart phone, a personal digital assistant (PDA), a portable multimedia player (PMP), a digital camera, a music player, a portable game console, a navigation system, etc. The foregoing is illustrative of exemplary embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims.

We claim:

1. A semiconductor device, comprising:
a memory array; and
a control architecture configured to control reading data from and writing data to the memory array, the control architecture configured to,
receive data and a codeword location in the memory array;
select one or more data units in the received data based on a data mask;
read a codeword currently stored at the codeword location in the memory array;
error correct the read codeword to generate a corrected read codeword;
form a new codeword from the selected data units of the received data and data units in the corrected read codeword that do not correspond to the selected data units; and
write the new codeword to the memory array.

2. The semiconductor device of claim 1, wherein the control architecture is configured to receive the data mask.

3. The semiconductor device of claim 2, wherein the control architecture is configured to receive the data mask from an external device.

4. The semiconductor device of claim 2, wherein the control architecture is configured to perform the selecting by selecting the data units in the received data not masked by the data mask.

5. The semiconductor device of claim 1, wherein the control architecture is configured to generate the data mask.

6. The semiconductor device of claim 5, wherein the control architecture is configured to generate the data mask when the received data has a size less than a size of a codeword.

7. The semiconductor device of claim 5, wherein the control architecture is configured to generate the data mask based on a received address.

8. The semiconductor device of claim 5, wherein the control architecture is configured to perform the selecting by selecting the data units in the received data not masked by the data mask.

9. The semiconductor device of claim 1, wherein the control architecture is configured to receive an address for the codeword location, and the control architecture is configured to read the read codeword based on the received address.

10. The semiconductor device of claim 1, wherein the control architecture is configured to perform the error correcting based on parity information in the read codeword.

11. The semiconductor device of claim 10, wherein the control architecture is configured to perform the forming by generating new parity bits, and to include the new parity bits in the new codeword.

12. The semiconductor device of claim 1, wherein the control architecture is configured to perform the forming by generating new parity bits, and to include the new parity bits in the new codeword.

13. The semiconductor device of claim 1, wherein the read codeword includes a message information portion and a parity information portion.

14. The semiconductor device of claim 13, wherein the message information portion includes a plurality of data units.

15. The semiconductor device of claim 14, wherein each of the data units is a byte.

16. The semiconductor device of claim 1, wherein
the memory array includes a plurality of chips; and
the read codeword is stored across more than one chip in the memory array.

17. A memory system, comprising:
a plurality of memory chips,
wherein each memory chip includes,
a memory array; and
a control architecture configured to control reading data from and writing data to the memory array, the control architecture configured to,
receive data and a codeword location in the memory array;
select one or more data units in the received data based on a data mask;
read a codeword currently stored at the codeword location in the memory array;
error correct the read codeword to generate a corrected read codeword;
form a new codeword from the selected data units of the received data and data units in the corrected read codeword that do not correspond to the selected data units; and
write the new codeword to the memory array.

18. A method of operating a semiconductor device, comprising:
receiving data and a codeword location in a memory array;
selecting one or more data units in the received data based on a data mask;
reading a codeword currently stored at the codeword location in the memory array;
error correcting the read codeword to generate a corrected read codeword;
forming a new codeword from the selected data units of the received data and data units in the corrected read codeword that do not correspond to the selected data units; and
writing the new codeword to the memory array.

19. The method of claim 18, wherein further comprising:
receiving the data mask.

20. The method of claim 19, wherein the receiving the data mask receives the data mask from an external device.

21. The method of claim 19, wherein the selecting selects the data units in the received data not masked by the data mask.

22. The method of claim 18, further comprising:
generating the data mask.

23. The method of claim 22, wherein the generating generates the data mask when the received data has a size less than a size of a codeword.

24. The method of claim 22, wherein the generating generates the data mask based on a received address.

25. The method of claim 22, wherein the selecting selects the data units in the received data not masked by the data mask.

26. The method of claim 18, wherein the receiving receives an address for the codeword location, and the reading reads the read codeword based on the received address.

27. The method of claim 18, wherein the error correcting error corrects based on parity information in the read codeword.

28. The method of claim 27, wherein the forming generates new parity bits, and includes the new parity bits in the new codeword.

29. The method of claim 18, wherein the forming generates new parity bits, and includes the new parity bits in the new codeword.

30. The method of claim 18, further comprising:
   at least one of receiving and generating the data mask.

31. The method of claim 18, wherein the read codeword includes a message information portion and a parity information portion.

32. The method of claim 31, wherein the message information portion includes a plurality of data units.

33. The method of claim 32, wherein each of the data units is a byte.

34. The method of claim 18, wherein
   the memory array includes a plurality of chips; and
   the reading reads portions of the read codeword from more than one chip in the memory array.

\* \* \* \* \*